(12) United States Patent
Higgins, III et al.

(10) Patent No.: US 8,907,485 B2
(45) Date of Patent: Dec. 9, 2014

(54) COPPER BALL BOND FEATURES AND STRUCTURE

(75) Inventors: Leo M. Higgins, III, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/594,732

(22) Filed: Aug. 24, 2012

(65) Prior Publication Data

US 2014/0054781 A1   Feb. 27, 2014

(51) Int. Cl.
H01L 23/49 (2006.01)
H01L 21/607 (2006.01)
H01L 21/603 (2006.01)
H01L 23/485 (2006.01)

(52) U.S. Cl.
USPC .............. 257/762; 257/E23.02; 257/E21.499; 257/E23.024; 257/E21.59; 257/E21.519; 257/E21.518; 257/773; 257/751; 257/690; 257/737; 257/738; 257/734; 257/750; 257/774; 257/776; 257/780; 257/698; 438/612; 228/110.1

(58) Field of Classification Search
USPC .......... 257/E21.502, 751, 690, 737, 738, 734, 257/E23.02, 750, 774, 773, 776, 779, 780, 257/698, 739, E21.499, E23.024, E21.59, 257/E21.519, E21.518; 438/612; 228/110.1
See application file for complete search history.

(56) References Cited

U.S. PATENT DOCUMENTS

| 6,113,728 A * | 9/2000 | Tsukagoshi et al. ........... 156/264 |
| 6,213,378 B1 | 4/2001 | Singh |
| 6,294,837 B1 * | 9/2001 | Akram et al. .................. 257/774 |
| 6,314,641 B1 * | 11/2001 | Akram ............................ 29/843 |
| 6,339,247 B1 * | 1/2002 | Taguchi ......................... 257/433 |
| 6,605,854 B2 * | 8/2003 | Nagase et al. ................. 257/476 |
| 6,696,757 B2 * | 2/2004 | Yunus et al. ................... 257/735 |
| 6,952,054 B2 * | 10/2005 | Akram et al. .................. 257/774 |
| 7,030,496 B2 * | 4/2006 | Shinyama et al. ............. 257/773 |
| 7,951,702 B2 * | 5/2011 | Wood et al. .................... 438/617 |
| 8,043,956 B2 | 10/2011 | Lehr et al. |
| 8,105,933 B2 * | 1/2012 | Hess et al. ...................... 438/612 |
| 8,569,163 B2 * | 10/2013 | Sekihara et al. ............... 438/617 |
| 2003/0234447 A1 * | 12/2003 | Yunus et al. ................... 257/739 |
| 2010/0096437 A1 * | 4/2010 | Nakao ......................... 228/110.1 |
| 2010/0327440 A1 | 12/2010 | Pozder et al. |
| 2011/0068469 A1 | 3/2011 | Yow et al. |
| 2012/0001336 A1 | 1/2012 | Zeng et al. |
| 2012/0153464 A1 * | 6/2012 | Hess et al. ...................... 257/737 |
| 2012/0273954 A1 * | 11/2012 | Higgins, III ................... 257/762 |
| 2012/0299187 A1 * | 11/2012 | Oertle et al. ................... 257/762 |
| 2013/0147295 A1 * | 6/2013 | Shimizu .......................... 310/90 |
| 2014/0061933 A1 * | 3/2014 | Daubenspeck et al. ........ 257/773 |

* cited by examiner

*Primary Examiner* — Alexander Oscar Williams
(74) *Attorney, Agent, or Firm* — Terrile, Cannatti, Chambers & Holland, LLP; Michael Rocco Cannatti

(57) ABSTRACT

An integrated circuit wire bond connection is provided having an aluminum bond pad (51) that is directly bonded to a copper ball (52) to form an aluminum splash structure (53) and associated crevice opening (55) at a peripheral bond edge of the copper ball (54), where the aluminum splash structure (53) is characterized by a plurality of geometric properties indicative of a reliable copper ball bond, such as lateral splash size, splash shape, relative position of splash-ball crevice to the aluminum pad, crevice width, crevice length, crevice angle, and/or crevice-pad splash index.

20 Claims, 17 Drawing Sheets

COPPER BALL BOND FEATURES AND STRUCTURE

BACKGROUND OF THE INVENTION

1. Field of the Invention

The present invention is directed in general to semiconductor devices and methods for manufacturing same. In one aspect, the present invention relates to wire ball bonding and associated methods of fabricating and testing same.

2. Description of the Related Art

Ball bonding is widely employed in the semiconductor packaging industry to form electrical connections between an integrated circuit die and a die carrier such as a lead frame or a substrate. Conventional ball bonding processes typically use a combination of heat, pressure and ultrasonic energy to form an intermetallic connection or weld between a wire and a connection pad. However, the connection pad is typically subjected to a number of stressors such as impact force, contact power, contact force, bond power and bond force during the ball bonding process, leading to mechanical integrity problems, such as cracks between the connection pad and bonding ball that can form during bonding, device operation or device testing, such as highly accelerated stress test (HAST). Such reliability concerns are exacerbated with copper ball bonds which have a narrower process window than with gold ball bonds.

BRIEF DESCRIPTION OF THE DRAWINGS

The present invention may be understood, and its numerous objects, features and advantages obtained, when the following detailed description is considered in conjunction with the following drawings, in which.

Figure 1:
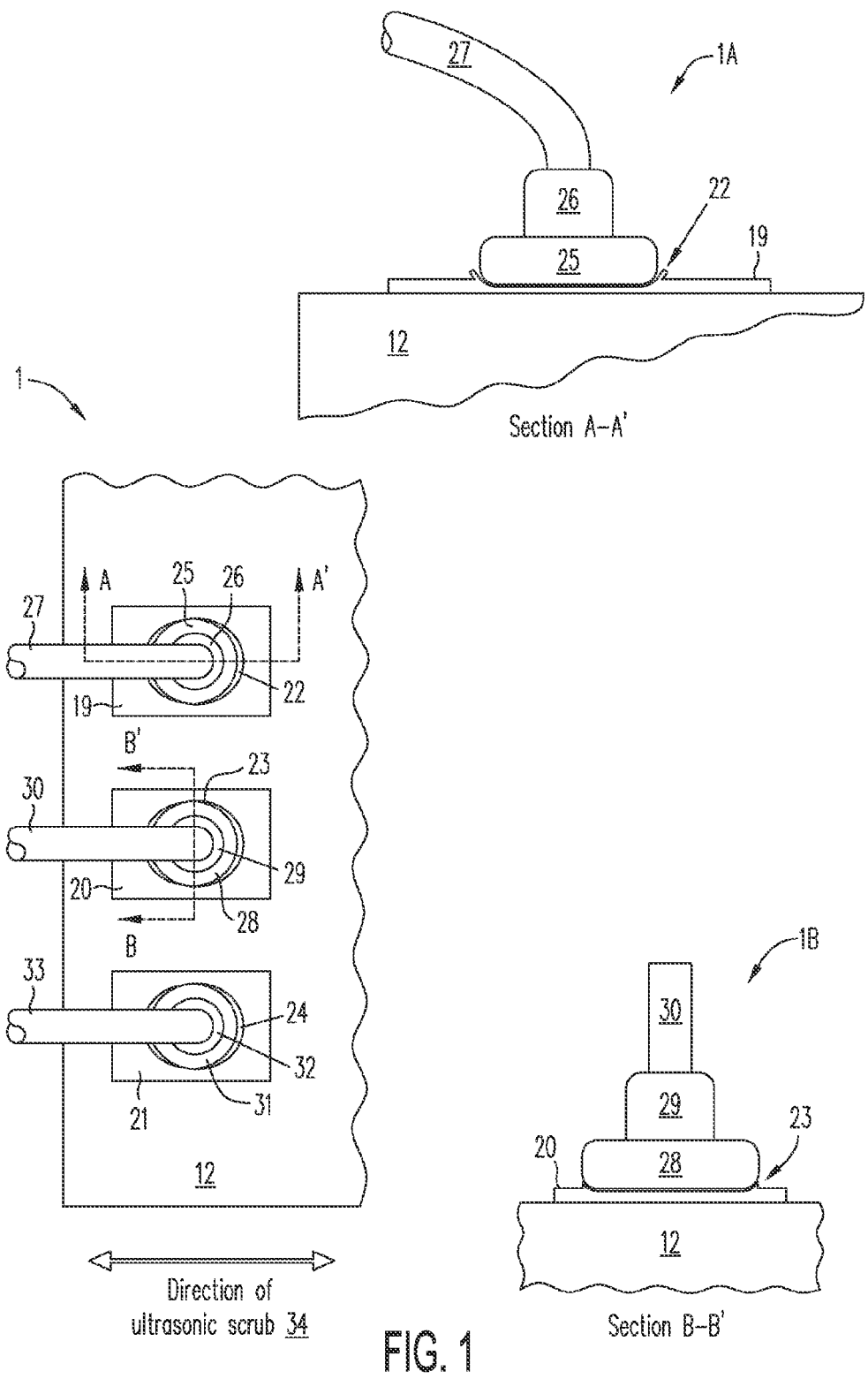
FIG. 1 is a top plan view of a semiconductor die edge having copper wirebonds affixed to bond pads, along with enlarged front and side views of a copper wirebond and bond pad structure in accordance with selected embodiments.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for forming reliable copper ball bonds on aluminum pads by controlling the bonding parameters to form aluminum splash features meeting a plurality of geometric structural requirements relating to the aluminum splash profile and the size and position of the crevice or gap between the aluminum splash and copper ball. In selected embodiments, the plurality of geometric structural requirements include the lateral splash size, splash shape, relative position of splash-ball crevice to the aluminum pad, crevice width, crevice length, crevice angle, and/or crevice-pad splash index. To form reliable copper ball bonds, the splash should be formed around substantially the entire perimeter of the ball bond and have a limited extent beyond the perimeter of the ball bond. In addition, the elevated splash pad dimension (LB) should be less than or equal to twice the outermost lateral splash length dimension (LS). Reliable copper ball bonds are also obtained when the splash-ball crevice is positioned above the top of the aluminum pad, thereby minimizing opportunities for undesirable mold compound penetration. In addition, short crevice lengths and narrow crevice widths reduce the probability of undesirable mold compound penetration. To prevent mold compound penetration, a controlled crevice-pad splash index ($\beta$) defining an angle between the aluminum pad and the aluminum splash is controlled to be within a predetermined range (e.g., of 20-75°). Copper ball bonding reliability is also promoted by controlling the splash height ($H_p$) to be less than half the ball height and greater than half the aluminum pad thickness. Other geometric structural features which may be used to realize reliable copper ball bonds include a crevice width, crevice length, and crevice angle ($\alpha$) defining an angle between the aluminum pad and the aluminum splash, when these features are controlled to be within a predetermined range. The geometric features of the aluminum splash on different copper ball bond perimeter regions are likely to be different, with larger aluminum splash on perimeter regions substantially perpendicular to the direction of ultrasonic vibration, and smaller aluminum splash on perimeter regions substantially parallel to the direction of ultrasonic vibration. Consequently, the geometric features of the aluminum splash in copper ball bond cross-sections may be assessed in both perpendicular and parallel to the direction of the ultrasonic vibration. The geometric features described hereinbelow apply to aluminum splash displayed in cross-sections through the center of copper ball bonds where the cross-sections were made in directions both perpendicular and parallel to the direction of ultrasonic vibration.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of an integrated circuit device with a copper wire bonded to a connection pad without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a top plan view 1 of a semiconductor die edge having copper wire bonds affixed to bond pads, along with enlarged front view 1A (along view lines A-A') and side view 1B (along view lines B-B'). As illustrated in the plan view 1, a plurality of bonding sites are formed on an integrated circuit die 12 which may be attached to a die carrier (not shown) having a substrate or a lead frame. As integrated circuit dies, substrates, lead frames, and their respective bonding sites are known to those of ordinary skill in the art, detailed descriptions thereof are not necessary for a full understanding of the invention. On the IC die 12, there is formed one or more connection pads 19-21, each of which may be formed as sensitive pad structures such as, for example, bond over active (BOA) pad structures, or bond pads formed over a low-k dielectric structure or via design. In selected embodiments, the connection pads 19-21 may have a metal thickness of less than 1.5 µm, but may be ≥2.8 µm in thickness, and may be formed with aluminum (Al) or other electrically conductive material as is known in the art. It should however be understood by those of skill in the art that the present invention is not limited by the type or thickness or material used for the connection pads which will depend on the application.

A plurality of wire ball bond element 25-33 electrically connects the connection pads 19-21 to external bonding sites (not shown). For example, a first wire bond—including a ball bond contact portion 25, interconnection portion 26 and wire conductor portion 27—is formed and affixed to a first connection pad 19. In similar fashion, a second wire bond (including ball bond contact portion 28, interconnection portion 29, and wire conductor portion 30) is attached to a second connection pad 20, and a third wire bond (including ball bond contact portion 31, interconnection portion 32, and wire conductor portion 33) is attached to a third connection pad 21. The wire bonds may be formed with copper (Cu) or other electrically conductive materials known in the art, such as with gold (Au), aluminum (Al), and the like. Though illustrated as separate portions, it will be appreciated that each wire bond may be formed as a single, integrated conductor.

To attach each wire bond to a corresponding connection pad (e.g., 19, 20), a controlled ball bonding process uses a specified combination of heat, pressure and ultrasonic energy to form an intermetallic connection or weld between the wire bond and connection pad. In particular, the bonding process is controlled to form splash features 22-24 extending from the connection pad at the base of the ball bond contact portion which have a predetermined splash profile and associated crevice or gap profile between the splash feature and copper ball bond. As described more fully hereinbelow, a splash feature is formed when material from the connection pad is displaced by the ball bond during the bonding process so that at least part of the splash feature is raised or elevated above the original top surface of the connection pad. To promote reliability, the splash feature should be formed around substantially the entire perimeter of the ball bond, though some short breaks in the continuity of the splash feature are acceptable. In addition, the splash feature should substantially extend to at least the perimeter of the ball bond but should not extend substantially past the perimeter of the ball bond Depending on the specifics of the ball bonding process, the shape and extent of the splash feature may be different at different parts of the ball bond perimeter. This is shown in the plan view 1 where the side-to-side direction 34 of the wire bond transducer movement during the ultrasonic 'scrub' portion of the Cu ball bonding process creates splash features 22-24 having a lateral extent that is greater in the direction parallel to scrub motion than in the direction perpendicular to the scrub motion. The differences in lateral extent are clearly seen in the enlarged front view 1A of the first wire bond 25-27 and connection pad 19 (along view lines A-A') where the lateral extent of the splash feature 22 formed at the inner and outer segments of the ball bond extends past the perimeter of the ball bond contact portion 25. In contrast, the enlarged front view 1B of the wire bond 28-30 and connection pad 20 (along view lines B-B') shows that the lateral extent of the splash feature 23 formed at the lateral segments of the ball bond does not quite extend to the perimeter of the ball bond contact portion 28, but nonetheless provides a minimum amount of splash.

Figure 2:
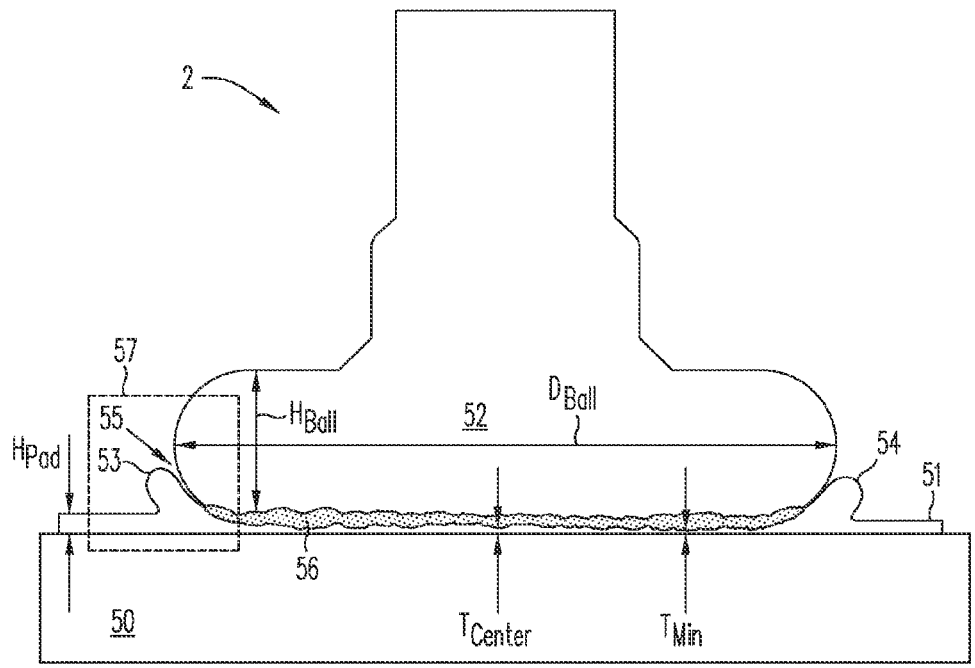
FIG. 2 is a schematic cross section of a copper ball bond on an aluminum pad showing an aluminum splash formed on inner and outer segments of ball bond perimeter.

In addition to controlling the lateral extent of the splash features, the bonding process parameters are applied to form splash features having multiple geometric structural features relating to the aluminum splash profile and the size and position of the crevice or gap between the aluminum splash and copper ball. To illustrate the construction of the geometric structural features, reference is now made to FIG. 2 which shows a schematic cross section view 2 of a copper ball bond 52 on an aluminum bond pad 51 showing aluminum splash features 53-54 formed on inner and outer segments of ball bond perimeter to extend past the perimeter of the ball bond 52. The depicted cross-sectional view 2 is through the center of the ball bond 52 and parallel to the direction of the wire bond transducer movement during the ultrasonic scrub portion of the copper ball bonding process.

The bonding ball 52 may be a deformed ball bond characterized by a ball bond height dimension (HBall) measured from the original surface of the bond pad 51 to the top of the ball bond base, and a ball bond diameter dimension (DBall) measured across the lateral extent of the ball bond base. In addition, the bond pad 51 is characterized by a bonding pad thickness dimension (HPad). In selected embodiments, the bonding ball 52 has a ball bond diameter dimension (DBall) of, for example, between about 30-125 µm, and a predetermined ball bond height dimension (HBall) of, for example, between about 7-50 µm, though it will be appreciated that the dimensions of the preformed bonding ball 52 may depend on, among other things, the subsequent ball bond requirements, the wire type employed, the wire diameter, and the bonding process parameters such as, for example, the impact force applied. These dimensions may be combined to form a ball bond ratio (BBR) parameter that is defined by the ratio of the ball bond height dimension (HBall) and the ball bond diameter dimension (DBall), where the BBR parameter should be in the range of 18-35% to be optimized for copper wire bonding.

In addition to the dimensions of the bonding ball, there are other geometric structural features at the interface between a copper ball bond and aluminum bond pad that have a significant impact on the ball bond reliability where properly optimized. To illustrate and define the critical set of copper ball bond and aluminum pad geometrical features needed for a reliable copper ball bond, reference is now made to FIG. 3 which shows an enlarged schematic cross section view 3 of the area 57 (shown in FIG. 2) to illustrate selected geometric features of the aluminum splash 53 interface with the copper ball bond 52 and aluminum pad 51. There are a number of geometric features characterizing the bonding interface between the copper ball 52 and aluminum bond pad 51, including an aluminum splash 53 that is formed to define a crevice 55 with the copper ball bond 52.

Figure 3:
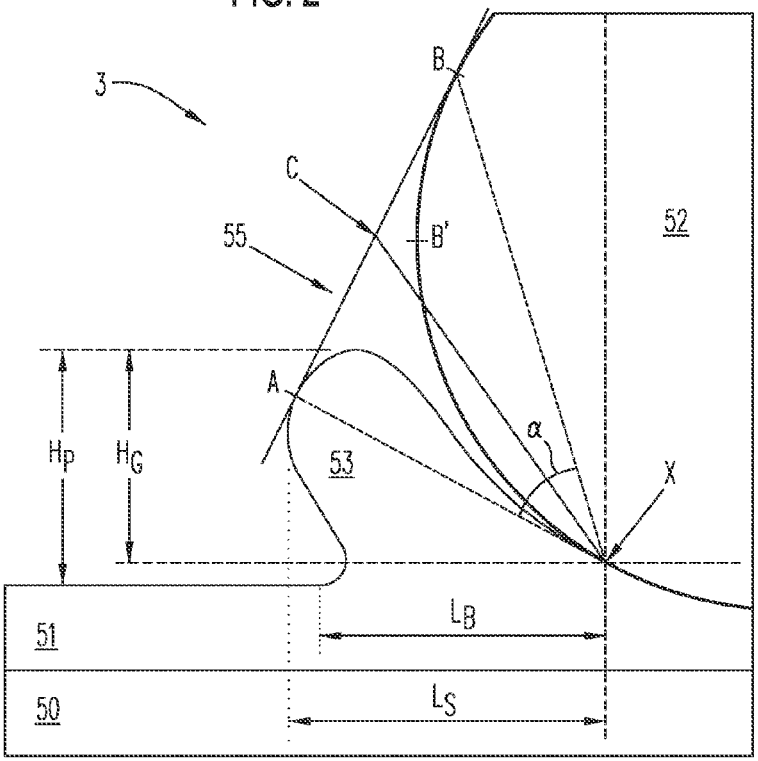
FIG. 3 is an enlarged schematic cross section of selected geometric features of the aluminum splash and crevice formed at the interface between a copper ball bond and aluminum pad.

A first geometric structural feature of the aluminum splash interface is the lateral splash size of the aluminum splash 53. In FIG. 3, the lateral splash size is the length of region where the aluminum splash 53 is raised above the top surface plane of the original aluminum pad 51. One way of measuring the lateral splash size is the lateral splash distance (LS) from the crevice initiation point (X) to the outermost extent of a splash 53 that has an undercut region. The lateral splash size may also be measured as the lateral base distance (LB) from the crevice initiation point (X) to the furthest point where the displaced aluminum pad is elevated above the top surface plane of the original aluminum pad. As will be appreciated, the lateral base dimension (LB) will exist with a splash that has an undercut (such as shown in FIG. 3), and also with splash that has no undercut (e.g., a gentle wave). In any case, the bonding process should be controlled to form lateral aluminum splash structures around substantially the entire perimeter of the ball bond 52, thereby providing a structural indication that the applied bonding parameters have displaced pad aluminum to form a reliable bond. The desired size of the aluminum splash 53 will be a function of at least the initial thickness and hardness of the aluminum pad 51. In addition, the bonding parameters are controlled so that the aluminum splash 53 should extend substantially to, but not substantially past, at least the perimeter of the ball bond 52. Generally, the lateral splash size may be limited to extend no more than a predetermined distance (e.g., 5 µm) beyond the perimeter of the copper ball bond base 52, though this may be reduced (e.g., no more than 3 µm) when the ball bond diameter DBall is constrained by a small bond pad opening. In selected embodiments for forming reliable copper ball bonds, the elevated splash pad dimension (LB) should be less than or equal to twice the outermost lateral splash length dimension (LS).

Another geometric structural feature of the aluminum splash interface is the shape of the aluminum splash 53. The aluminum splash can have a concave shape which follows the curved shape of the copper ball 52, can have a convex shape which curls or bends away from the curved shape of the copper ball 52, or can have an essentially linear or uncurved projection shape that extends linearly at any projection angle between the shape of the copper ball 52 and the top surface plane of the original aluminum pad 51. In general, the curvature of the upper surface of the splash feature that is closest to the copper ball determines whether the shape is concave (e.g., curving with the curvature of the copper ball) or convex (e.g., curving away from the curvature of the copper ball).

An additional geometric structural feature of the aluminum splash interface is the splash height to the top surface of the aluminum splash 53. As shown in FIG. 3, one way of measuring the splash height is the vertical pad distance ($H_P$) from the original top surface plane of the original aluminum pad 51 to the top surface of the aluminum splash 53. Another way of measuring the splash height is the vertical gap distance ($H_G$) from the horizontal plane of the crevice initiation point (X) to the top surface of the aluminum splash 53. To promote reliable copper ball bonding, the bonding process should be controlled so that the vertical pad distance ($H_P$) should be greater than 50% of the original bonding pad thickness (HPad) and less than 50% of the ball bond height (HBall), respectively. In addition or in the alternative, bond reliability is promoted by controlling the bonding parameters to form the aluminum splash 53 so that the vertical gap distance ($H_G$) is less than or equal to the vertical pad distance ($H_P$). In FIG. 3, this requirement is met since the horizontal plane of the crevice initiation point (X) is above the original top surface plane of the original aluminum pad 51.

There are other geometric structural features relating to the size and shape of the crevice or gap 55 between the aluminum splash 53 and copper ball 52, where the crevice 55 is characterized by crevice width, length, and angle features that are defined with reference to the crevice initiation point X. The crevice features (width, length, and angle) may be defined with a variety of different construction methods as described herein, though it will be appreciated that other construction methods may be used to define essentially the same features by other methods that are intended to be included in and covered by this disclosure. As shown in FIG. 3, a simplified method for constructing the crevice width AB may be to draw a tangent line AB across both the aluminum splash 53 (at tangent intersect point A) and copper ball 52 (at tangent intersect point B). Though not illustrated, the crevice width may instead be constructed by a line drawn across the aluminum splash 53 tangent intersect point A and a vertical tangent point on the copper ball 52 (at tangent intersect point B'). However the crevice width is defined, the crevice length XC may be defined by drawing a line from the crevice initiation point X to the midpoint C of the crevice width line (e.g., AB). In addition, the crevice angle may be defined as the angle ($\alpha$) between a first splash tangent line XA (drawn between the crevice initiation point X and tangent intersect point A) and a second ball tangent line XB (drawn between the crevice initiation point X and tangent intersect point B).

Figure 4:
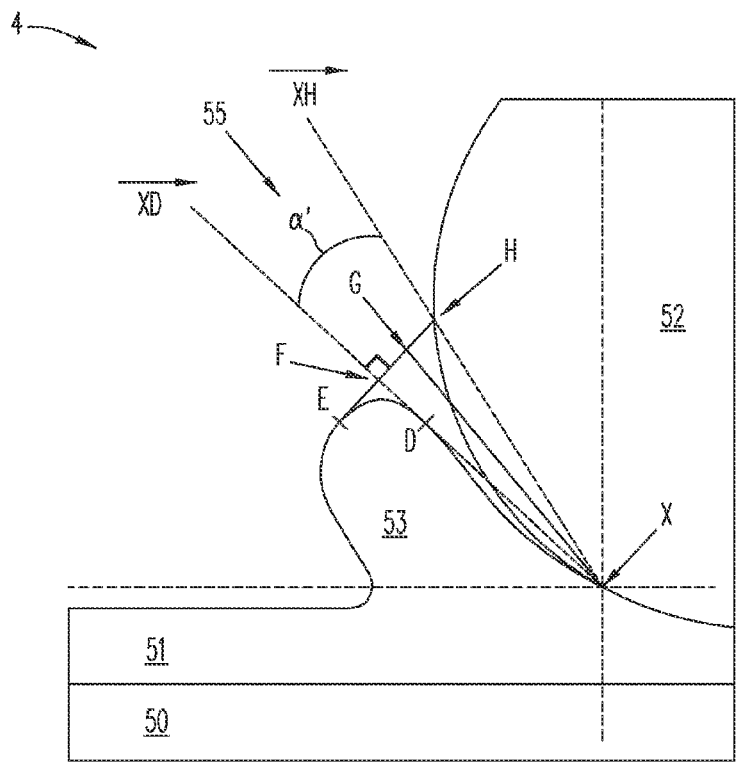
FIG. 4 is an enlarged schematic cross section of geometric features for a crevice formed at the interface between a copper ball bond and aluminum pad.

As indicated above, other construction methods may be used to define the crevice features (width, length, and angle). For example, reference is now made to FIG. 4 which shows an enlarged schematic cross section view 4 of the copper bonding ball and aluminum splash area in the area 57 (shown in FIG. 2) to illustrate the construction of a crevice width by first drawing a line from the crevice initiation point X through a first splash tangent intersect point D, creating line XD. Next, a second line EH is drawn that intersects perpendicularly with line XD at intersection point F, that is tangent with a second splash tangent intersect point E, and that intersects with copper ball intersect point H. In this example, the crevice width feature may be defined as the line segment EH extending between the second splash tangent intersect point E and the copper ball intersect point H. Alternatively, the crevice width feature may be defined as the line segment FH extending between the perpendicular intersection point F and the copper ball intersect point H. However the crevice width is defined, the crevice length XG may be defined by drawing a line from the crevice initiation point X to the midpoint G of the crevice width line (e.g., FH). In addition, the crevice angle may be defined as the angle ($\alpha'$) between a first splash tangent line XD (drawn between the crevice initiation point X and tangent intersect point D) and a second ball intersect line XH (drawn between the crevice initiation point X and copper ball intersect point H).

To promote reliable copper ball bonding, the bonding process should be controlled so that the crevice length is minimized, primarily by forming the crevice 55 so that the crevice initiation point X is above the top surface plane of the original aluminum pad 51. In addition, the crevice width should be minimized so as to reduce the probability of mold compound penetrating an undesirable distance under the ball bond. For long crevices, it is preferred to have a small crevice angle, while larger crevice angles are acceptable for shorter crevices. In selected embodiments, the crevice features should be formed so that the ratio of the crevice mouth width to crevice length is equal to or greater than 0.1. In other embodiments and as described more fully hereinbelow with reference to FIG. 21, the crevice features may be formed so that the ratio of the crevice width at the mid-point of the crevice to the crevice mouth width falls within a specified range (e.g., approximately 20%) to give an indication of the shape of the crevice which indicates how rapidly the crevice narrows.

Figure 5:
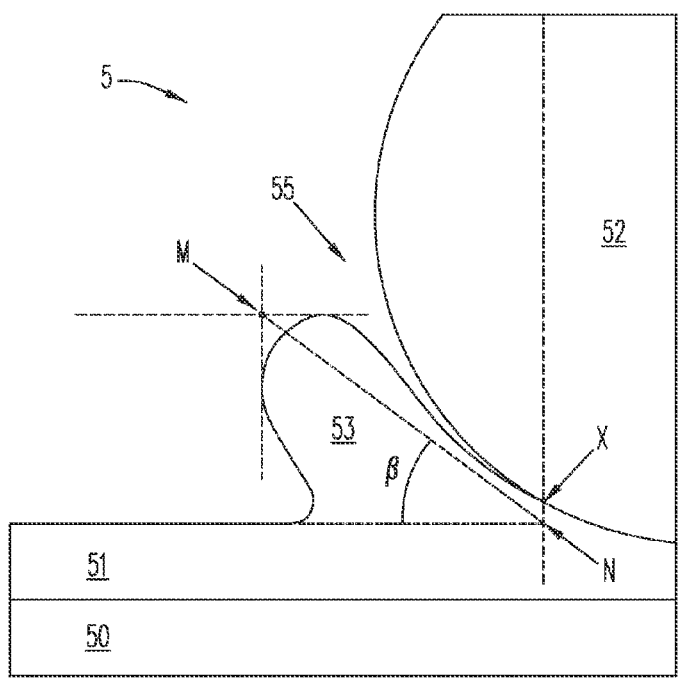
FIG. 5 is an enlarged schematic cross section of a splash index geometric feature of the aluminum splash formed at the interface between a copper ball bond and aluminum pad.
Figure 6:
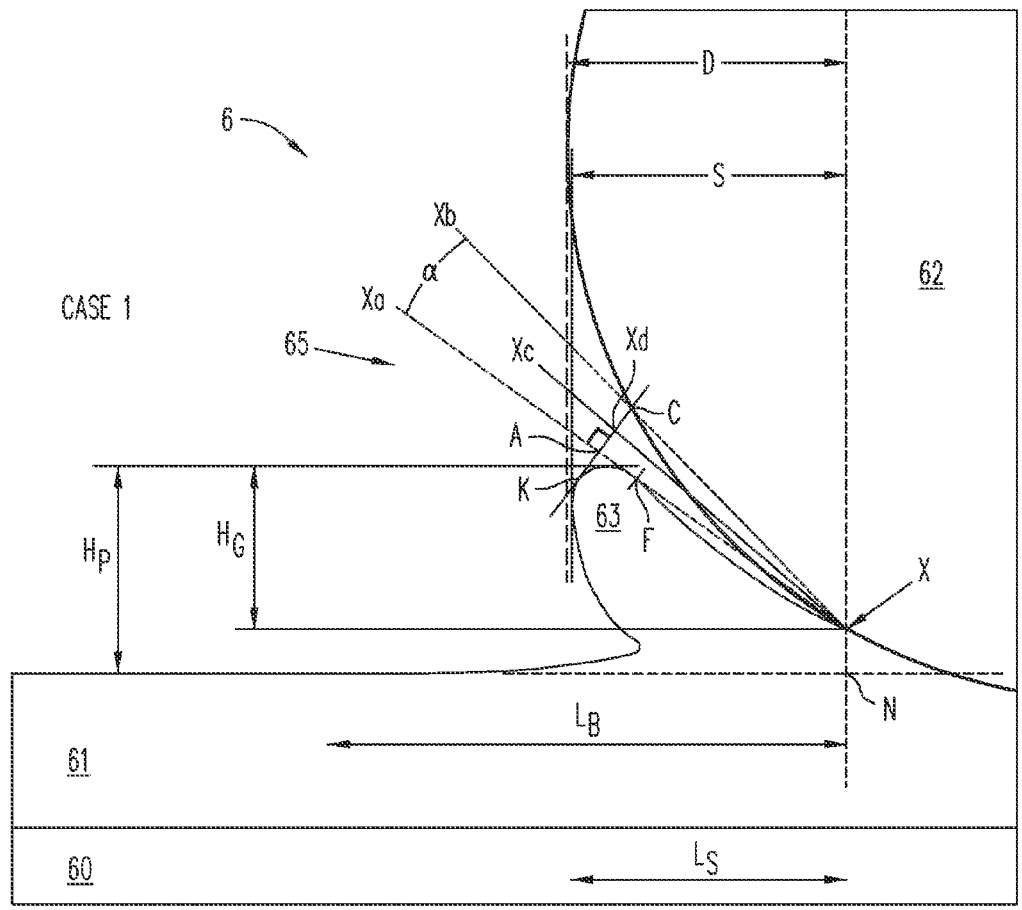
FIGS. 6-13 illustrate selected geometric features to different splash profiles formed by copper ball bonds affixed to aluminum pads.

Another geometric structural feature relating to the formation of reliable ball bonding is the crevice splash index angle of the aluminum splash in relation to the aluminum pad which gives an indication of the combined effects of the angle of the structure formed by the displaced Al (splash), and the shape and approximate angle of the crevice. The crevice splash index may be defined by construction method as shown in FIG. 5 which shows an enlarged schematic cross section view 5 of the copper bonding ball and aluminum splash area in the area 57 shown in FIG. 2 to illustrate the construction of a crevice splash index angle, though it will be appreciated that other construction methods may be used to define essentially the same features by other methods that are intended to be included in and covered by this disclosure. As shown in FIG. 5, the splash index may be constructed by first defining a splash extension point M that is the perpendicular intersection between horizontal and vertical tangent planes intersecting the aluminum splash 53. In addition, a vertical crevice extension point N is defined that is the perpendicular intersection between the top surface plane of the original aluminum pad 51 and the vertical plane extending through the crevice initiation point X. By drawing a splash extension line NM between the vertical crevice extension point N and the splash extension point M, the crevice splash index may be defined as the angle ($\beta$) between the splash extension line NM and the top surface plane of the original aluminum pad 51. The crevice splash index angle ($\beta$) provides a structural indication of the probability that subsequently injected mold compound will penetrate an undesirable distance under the ball bond 52, and the resulting probability of pad damage (cratering) during bonding. The smaller the angle ($\beta$), the greater the probability of undesirable mold compound penetration, and the greater the angle ($\beta$) the greater the probability of pad damage. With a small crevice splash index angle ($\beta$), the risk increases that mold compound may be forced with high pressure into the crevice 55, causing stress on the underside of the ball perimeter that acts to peel the ball from the aluminum pad surface 51, also increasing risk that mold compound may penetrate under the ball bond 52 by moving into the crevice and through a discontinuous intermetallic bond phase between the copper ball 52 and the aluminum pad 51 that is often present at the perimeter region of the ball bond. In addition, there is an increase in risk of cratering as the crevice splash index angle ($\beta$) increases, even with good copper-aluminum bonding. To promote reliable copper ball bonding, the bonding process should be controlled so that the crevice splash index angle ($\beta$) should be between 20-75°, depending on the hardness and thickness of the aluminum pad 51.

To further illustrate how selected geometric features can be applied to different cases where splash profiles are formed by copper ball bonds affixed to aluminum pads, reference is no made to FIGS. 6-13. In a first case shown in the cross-sectional view 6 of FIG. 6, a copper bond ball 62 is bonded to the aluminum bonding pad 61 formed on the integrated circuit die 60. The depicted bonding forms a small splash structure 63 having a concave shape that extends from a crevice initiation point X that is located above the top plane N of the aluminum pad 61 (e.g., $H_G<H_P$). To the extent that the lateral splash length dimension (LS) does not extend past the perimeter of the copper bond ball 62, this is a relatively small splash structure 63. In addition, the resulting crevice 65 formed between the copper bond ball 62 and splash structure 63 has a relatively short crevice width AC, crevice angle $\alpha$, and crevice length X-Xd which characterize a reliable bond connection between the copper bond ball 62 and aluminum bonding pad 61. In the example construction depicted in FIGS. 6-13, the crevice/ball bond dimension D is the horizontal distance from the crevice initiation point X to the outer edge of the ball bond base 62 and the crevice/splash dimension S is the horizontal distance from the crevice initiation point X to the outer edge of the aluminum splash 63. In addition, the crevice width AC is drawn along the tangent line KC (between aluminum splash tangent intersect point K and copper ball intersect point C and perpendicular to the tangent line Xa which is drawn from the crevice point X through the aluminum splash tangent intersect point F), such that the crevice width AC extends from point A (the intersection of lines KC and Xa) to point C (the copper ball intersect point from line KC). Alternatively, a crevice width KC dimension may be defined as the line drawn between aluminum splash tangent intersect point K and copper ball intersect point C and perpendicular to the tangent line Xa which is drawn from the crevice point X through the aluminum splash tangent intersect point F. A crevice length X-Xd dimension may also be defined as the line drawn from the crevice point X to the midpoint Xd along the crevice width line AC. The crevice width a may be defined by angle FXC, or alternatively as the angle between tangent line Xa and tangent line Xb (drawn between the crevice point X and the copper ball intersect point C).

Figure 7:
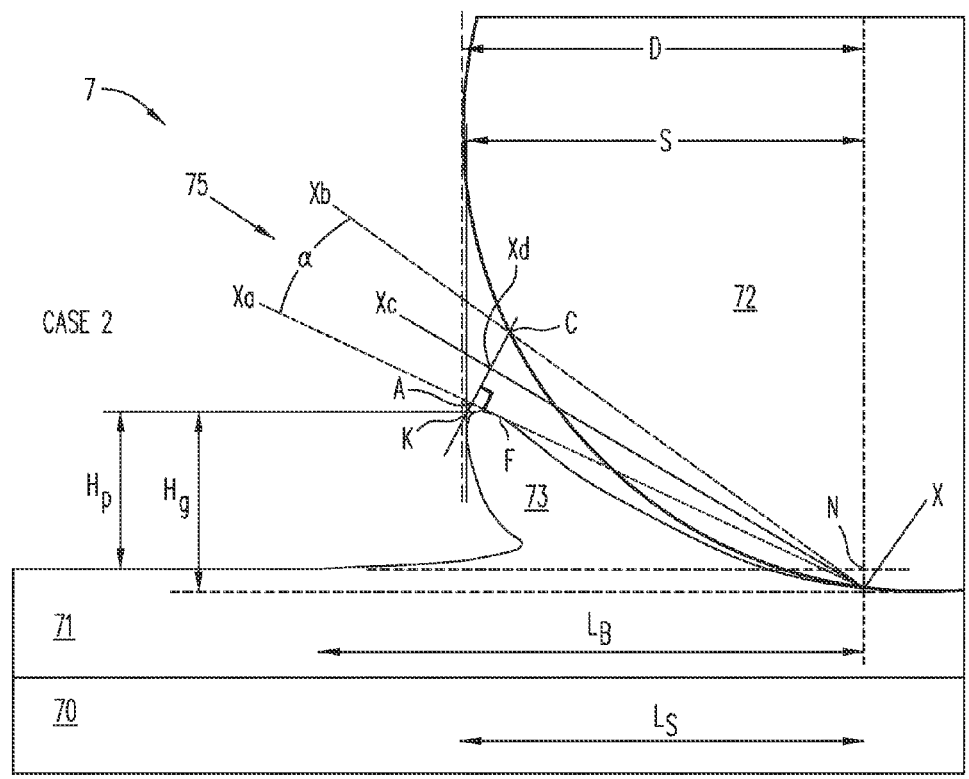

In a second case shown in the cross-sectional view 7 of FIG. 7, a copper bond ball 72 is bonded to the aluminum bonding pad 71 formed on the integrated circuit die 70. The depicted bonding forms a small splash structure 73 having a concave shape that extends from a crevice initiation point X that is located below the top plane N of the aluminum pad 71 (e.g., $H_P<H_G$). With the lateral splash length dimension (LS) not extending beyond the perimeter of the copper bond ball 72, this is a relatively small splash structure 73. Compared to the first case shown in FIG. 6, the crevice 75 formed between the copper bond ball 72 and splash structure 73 has a relatively long crevice length X-Xd which characterizes a relatively poor bond connection between the copper bond ball 72 and aluminum bonding pad 71 due to the reduced bond interface area and increased likelihood of mold compound penetration under the ball bond. In this example, the relatively long crevice between the aluminum splash structure 73 and copper bond ball 72, and extending below the top plane N of the aluminum pad 71, characterizes an unreliable bond.

Figure 8:
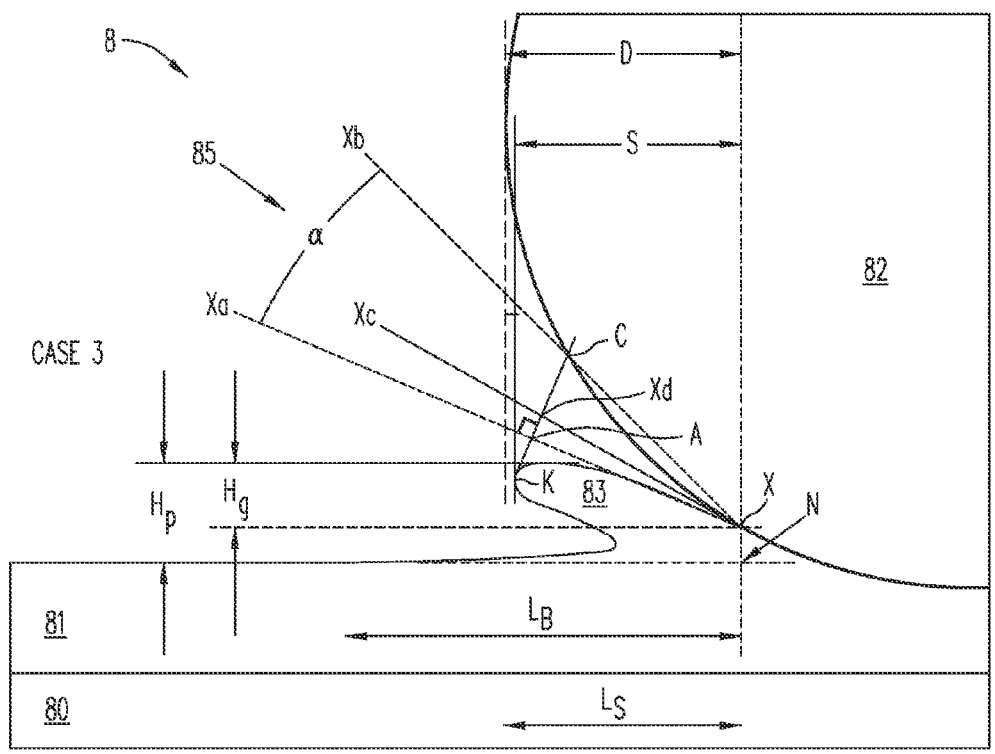

In a third case shown in the cross-sectional view 8 of FIG. 8, a copper bond ball 82 is bonded to the aluminum bonding pad 81 formed on the integrated circuit die 80. The depicted bonding forms a small splash structure 83 having a convex shape that extends from a crevice initiation point X that is located above the top plane N of the aluminum pad 81 (e.g., $H_G<H_P$). With the lateral splash length dimension (LS) extending substantially to, but not past, the perimeter of the copper bond ball 82, this is a relatively small splash structure 83. Although the crevice 85 formed between the copper bond ball 82 and splash structure 83 has a relatively larger crevice width (e.g., KC or AC) and crevice angle α than the first case shown in FIG. 6, the relatively short crevice length X-Xd characterizes a relatively reliable bond connection between the copper bond ball 82 and aluminum bonding pad 81.

Figure 9:
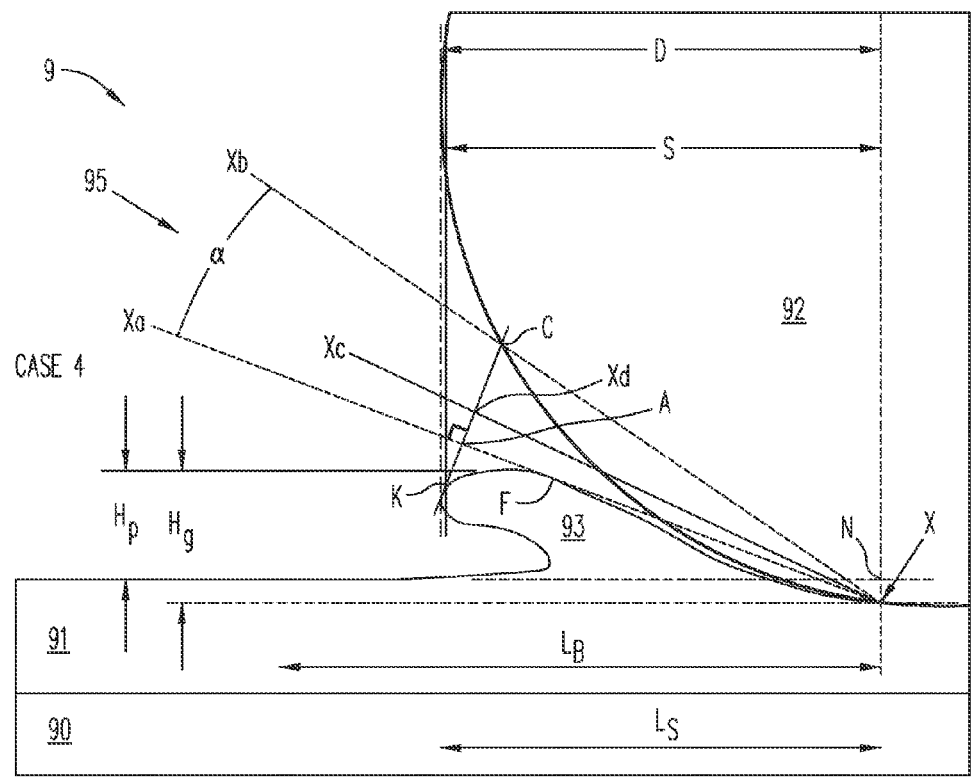

In a fourth case shown in the cross-sectional view 9 of FIG. 9, a copper bond ball 92 is bonded to the aluminum bonding pad 91 formed on the integrated circuit die 90. The depicted bonding forms a small splash structure 93 having a convex shape that extends from a crevice initiation point X that is located below the top plane N of the aluminum pad 91 (e.g., $H_P<H_G$). With the lateral splash length dimension (LS) extending substantially to, but not past, the perimeter of the copper bond ball 92, this is a relatively small splash structure 93. Compared to the first case shown in FIG. 6, the crevice 95 formed between the copper bond ball 92 and splash structure 93 has a wider crevice width (e.g., KC or AC), larger crevice angle α, and longer crevice length X-Xd which characterize a relatively poor bond connection between the copper bond ball 92 and aluminum bonding pad 91 due to the reduced bond interface area and increased likelihood of mold compound penetration under the ball bond. In this example, the relatively long crevice 95 between the aluminum splash structure 93 and copper bond ball 92 characterizes an unreliable bond.

Figure 10:
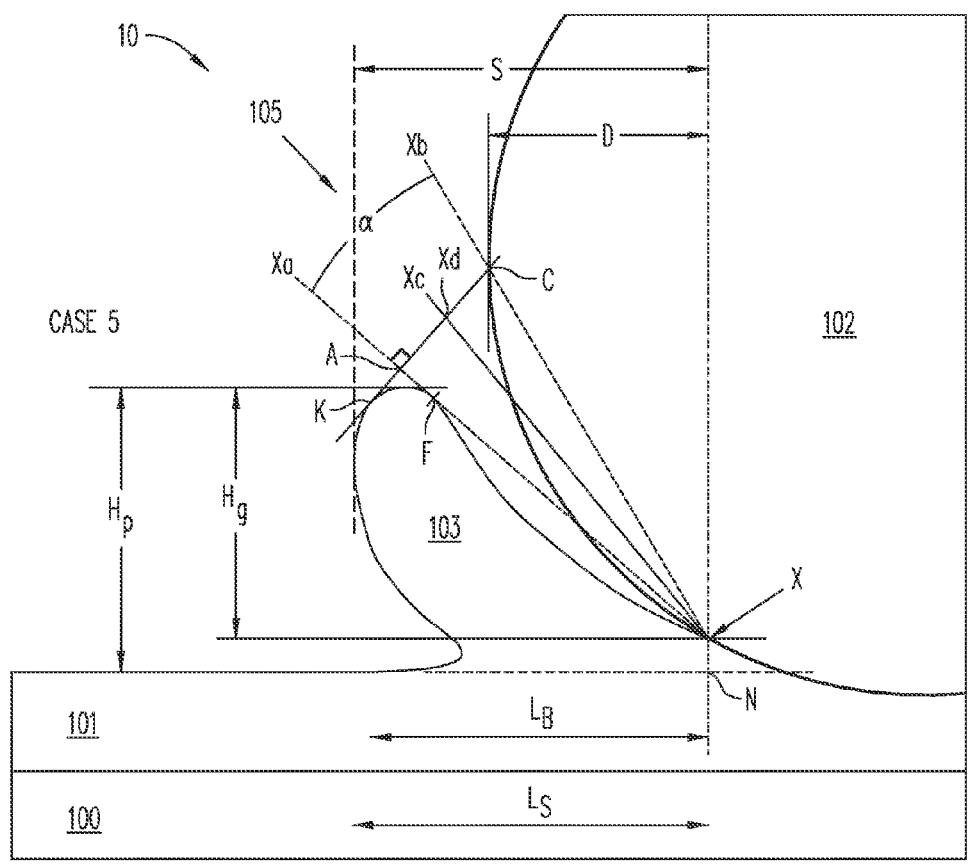

In a fifth case shown in the cross-sectional view 10 of FIG. 10, a copper bond ball 102 is bonded to the aluminum bonding pad 101 formed on the integrated circuit die 100. The depicted bonding forms a large splash structure 103 having a concave shape that extends from a crevice initiation point X that is located above the top plane N of the aluminum pad 101 (e.g., $H_G<H_P$). With the lateral splash length dimension (LS) extending past the perimeter of the copper bond ball 102, this is a relatively large splash structure 103. However, the lateral splash length dimension (LS) should be limited to a maximum value to prevent electrical connection and shorting to adjacent bond pads. Although the crevice 105 formed between the copper bond ball 102 and splash structure 103 have a larger crevice width (e.g., KC or AC) and crevice angle α than the first case shown in FIG. 6, the relatively short crevice length X-Xd characterizes a relatively reliable bond connection between the copper bond ball 102 and aluminum bonding pad 101. In this example, the relatively shallow size of the crevice 105 between the aluminum splash structure 103 and copper bond ball 102 characterizes a relatively reliable bond.

Figure 11:
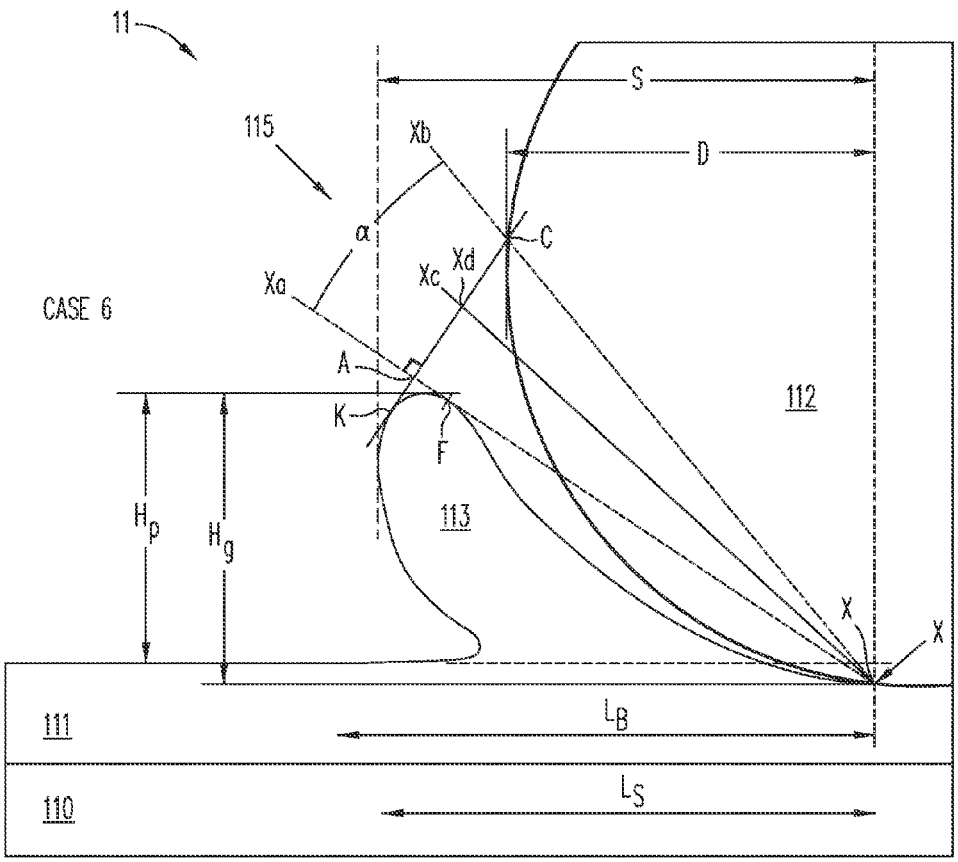

In a sixth case shown in the cross-sectional view 11 of FIG. 11, a copper bond ball 112 is bonded to the aluminum bonding pad 111 formed on the integrated circuit die 110. The depicted bonding forms a large splash structure 113 having a concave shape that extends from a crevice initiation point X that is located below the top plane N of the aluminum pad 91 (e.g., $H_P<H_G$). With the lateral splash length dimension (LS) extending past the perimeter of the copper bond ball 112, this is a relatively large splash structure 113. Compared to the fifth case shown in FIG. 10, the crevice 115 formed between the copper bond ball 112 and splash structure 113 has a longer crevice width (e.g., KC or AC) which characterizes a relatively poor bond connection between the copper bond ball 112 and aluminum bonding pad 111 due to the reduced connection area and increased likelihood of mold compound penetration under the ball bond. In this example, the relatively long crevice Xd for the crevice 115 between the aluminum splash structure 113 and copper bond ball 112 characterizes a less reliable bond than the fifth case.

Figure 12:
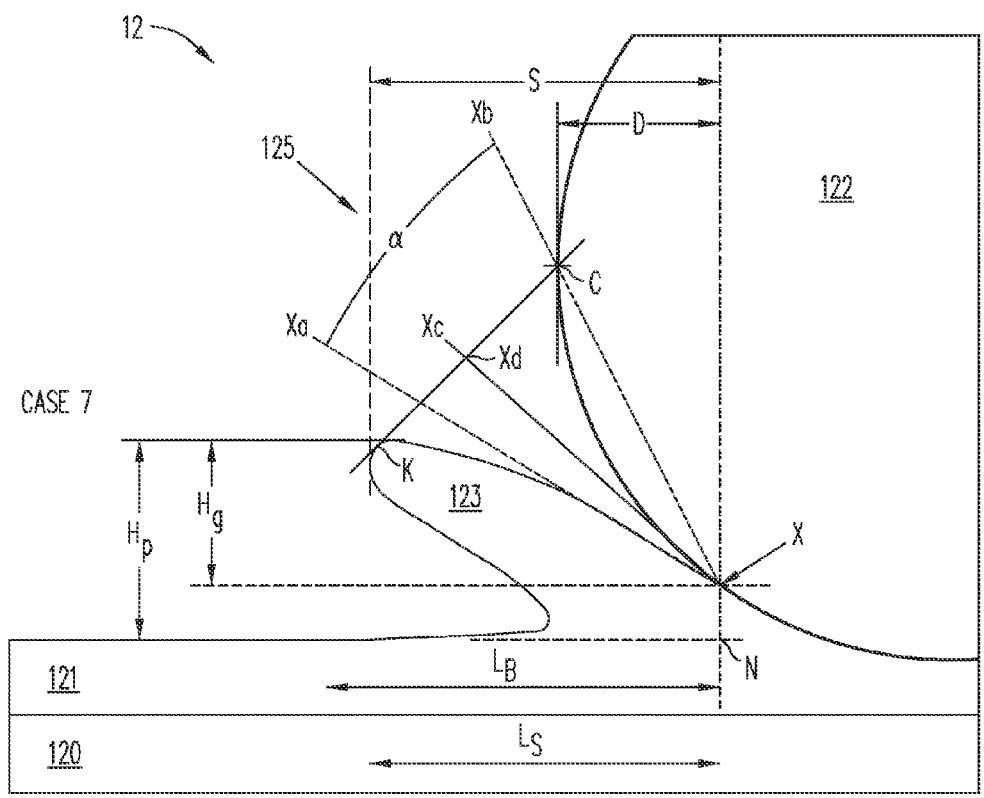

In a seventh case shown in the cross-sectional view 12 of FIG. 12, a copper bond ball 122 is bonded to the aluminum bonding pad 121 formed on the integrated circuit die 120. The depicted bonding forms a large splash structure 123 having a convex shape that extends from a crevice initiation point X that is located above the top plane N of the aluminum pad 121 (e.g., $H_G<H_P$). With the lateral splash length dimension (LS) extending past the perimeter of the copper bond ball 122, this is a relatively large splash structure 123. In the example construction depicted in FIGS. 12-13, the crevice width KC dimension may be defined as the tangent line KC extending from the outer or lateral most edge point C of the ball bond base 122 to the aluminum splash tangent intersect point K. With this construction, even though the crevice 125 formed between the copper bond ball 122 and splash structure 123 has relatively large crevice width KC and crevice angle α (compared to the first case shown in FIG. 6), the location of the horizontal plane of the crevice origin X above the top surface plane of the bonding pad 121 characterizes a relatively reliable bond connection between the copper bond ball 122 and aluminum bonding pad 121, though less reliable than the first case shown in FIG. 6.

Figure 13:
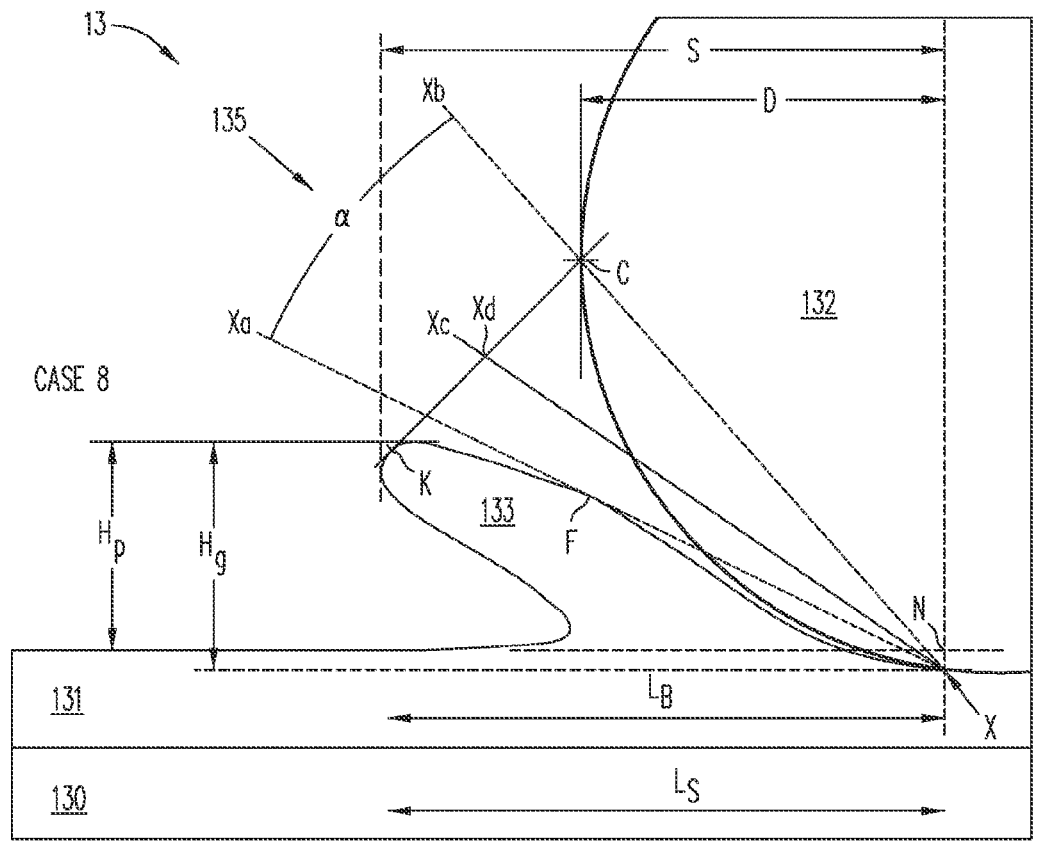

In an eighth case shown in the cross-sectional view 13 of FIG. 13, a copper bond ball 132 is bonded to the aluminum bonding pad 131 formed on the integrated circuit die 130. The depicted bonding forms a large splash structure 133 having a convex shape that extends from a crevice initiation point X that is located below the top plane N of the aluminum pad 131 (e.g., $H_P<H_G$). With the lateral splash length dimension (LS) extending past the perimeter of the copper bond ball 132, this is a relatively large splash structure 133. Compared to the seventh case shown in FIG. 12, the crevice 135 formed between the copper bond ball 132 and splash structure 133 has a longer crevice length KC which characterizes a relatively poor bond connection between the copper bond ball 132 and aluminum bonding pad 131 due to the reduced bond interface area and increased likelihood of mold compound penetration under the ball bond. In this example, the relatively long crevice length Xd for the crevice 135 between the aluminum splash structure 133 and copper bond ball 132 characterizes an unreliable bond.

As seen from the foregoing, different geometric features may be defined for different splash profile cases. For example, FIGS. 14-21 illustrate selected geometric features that can be constructed for aluminum splashes having a rolling wave profile where there is no undercut and the splash has no clearly defined outer edge. In the example construction depicted in FIGS. 14-21, the crevice/ball bond dimension D is the horizontal distance from the crevice initiation point X to the outer edge of the ball bond base (e.g., 142). However, when the splash structure (e.g., 143) is a rolling wave or sine wave type splash with no undercut, the crevice/splash dimension S may be defined as the horizontal distance from the crevice initiation point X to the topmost point E of the rolling aluminum splash wave (e.g., 143). In addition, the crevice width EB may be constructed as the line EB drawn from the topmost splash point E along a line that is perpendicular to the line Xa (which is drawn from the crevice point X through the topmost aluminum splash point E) to the copper ball intersect point B. A crevice length X-Xd dimension may also be defined as the line drawn from the crevice point X to the midpoint Xd along the crevice width line EB. The crevice width a may be defined by angle EXB, or alternatively as the angle between line Xa and line Xb (drawn between the crevice point X and the copper ball intersect point B). There may also be defined a lateral splash size in terms of a lateral base distance (LB) from the crevice initiation point (X) to the furthest point where the displaced aluminum pad is elevated above the top surface plane of the original aluminum pad. Finally, a splash index may be constructed by first defining a splash extension point T at the intersection point between the horizontal tangent plane through the topmost splash point E and the splash tangent line PT extending from the aluminum pad elevation point P. Next, a vertical crevice extension point N is defined that is the perpendicular intersection between the top surface plane of the original aluminum pad 141 and the vertical plane extending through the crevice point X. By drawing a splash extension line NT between the vertical crevice extension point N and the splash extension point T, the crevice splash index may be defined as the angle (β) between the splash extension line NT and the top surface plane of the original aluminum pad 141.

Figure 14:
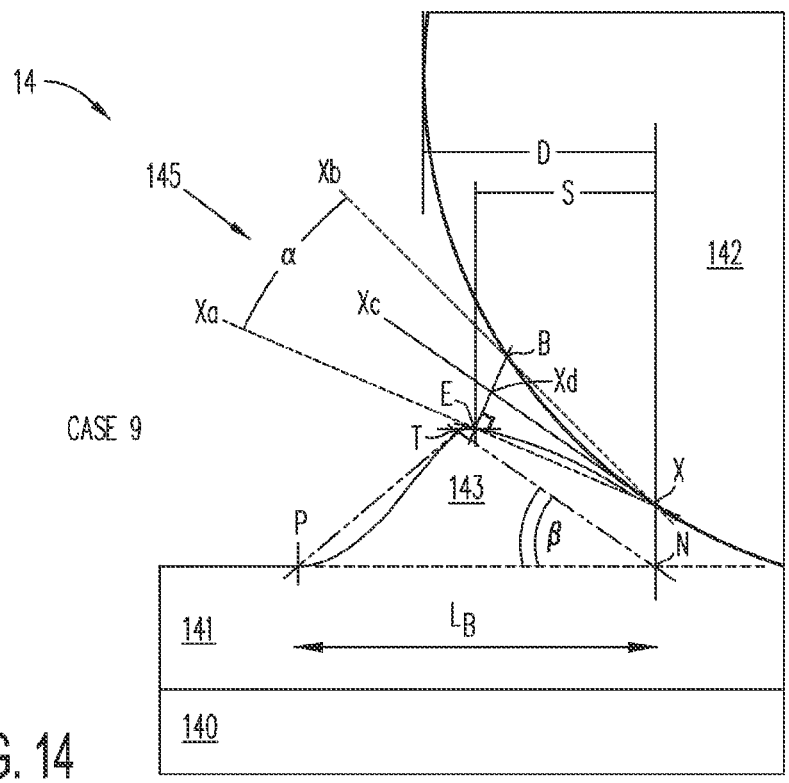
FIGS. 14-21 illustrate selected geometric features to different wave splash profiles formed by copper ball bonds affixed to aluminum pads.

With these geometric constructions in mind, a ninth case is shown in the cross-sectional view 14 of FIG. 14 which depicts a copper bond ball 142 bonded to the aluminum bonding pad 141 formed on the integrated circuit die 140. The depicted bonding forms a small wave-shaped splash structure 143 having a convex shape that extends from a crevice initiation point X that is located above the top plane of the aluminum pad 141 (e.g., $H_G<H_P$). To the extent that the lateral base length dimension (LB) extends slightly past the perimeter of the copper bond ball 142 and the crevice/splash dimension S is less than the crevice/ball bond dimension D, this is a relatively small wave splash structure 143. In addition, the resulting crevice 145 formed between the copper bond ball 142 and convex wave splash structure 143 has a relatively short crevice width EB, crevice angle α, and crevice length X-Xd which characterize a reliable bond connection between the copper bond ball 142 and aluminum bonding pad 141.

Figure 15:
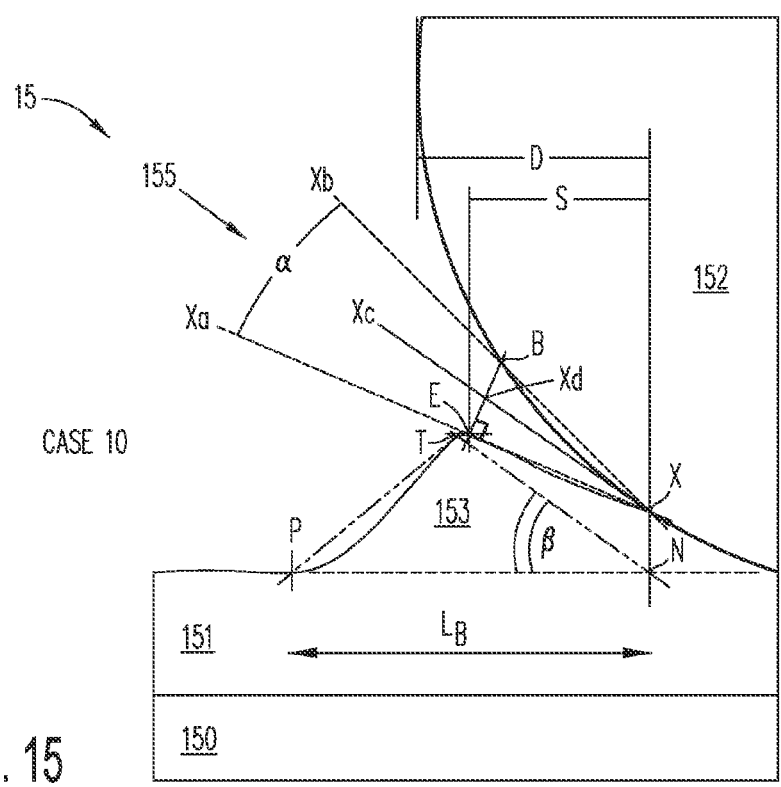

In a tenth case shown in the cross-sectional view 15 of FIG. 15, a copper bond ball 152 is bonded to the aluminum bonding pad 151 formed on the integrated circuit die 150. The depicted bonding forms a small wave-shaped splash structure 153 having a concave shape that extends from a crevice initiation point X that is located above the top plane of the aluminum pad 141 (e.g., $H_G<H_P$). With the crevice/splash dimension S being less than the crevice/ball bond dimension D, this is a relatively small wave splash structure 153. In addition, the resulting crevice 155 formed between the copper bond ball 152 and concave wave splash structure 153 has a relatively short crevice width EB, crevice angle α, and crevice length X-Xd which characterize a reliable bond connection.

Figure 16:
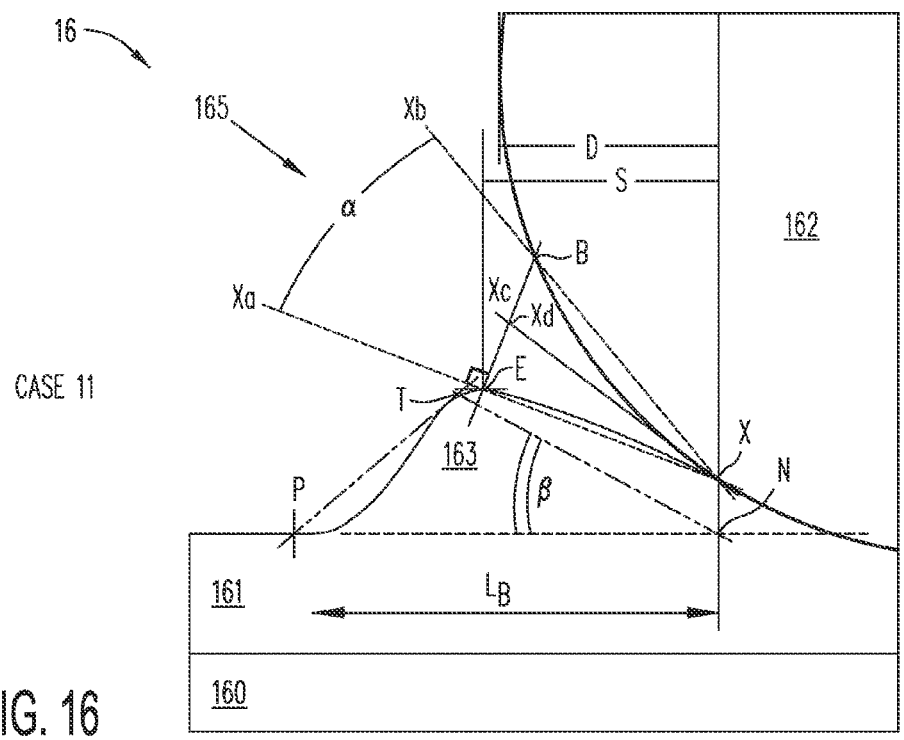

In an eleventh case shown in the cross-sectional view 16 of FIG. 16, a copper bond ball 162 is bonded to the aluminum bonding pad 161 formed on the integrated circuit die 160. The depicted bonding forms a large wave-shaped splash structure 163 having a convex shape that extends from a crevice initiation point X that is located above the top plane of the aluminum pad 161 (e.g., $H_G<H_P$). With the crevice/splash dimension S being larger than the crevice/ball bond dimension D and the lateral base length dimension (LB) extending past the perimeter of the copper bond ball 162, this is a relatively large wave splash structure 163. In addition, the resulting crevice 165 formed between the copper bond ball 162 and convex wave splash structure 163 has a relatively short crevice width EB, crevice angle α, and crevice length X-Xd which characterize a reliable bond connection.

Figure 17:
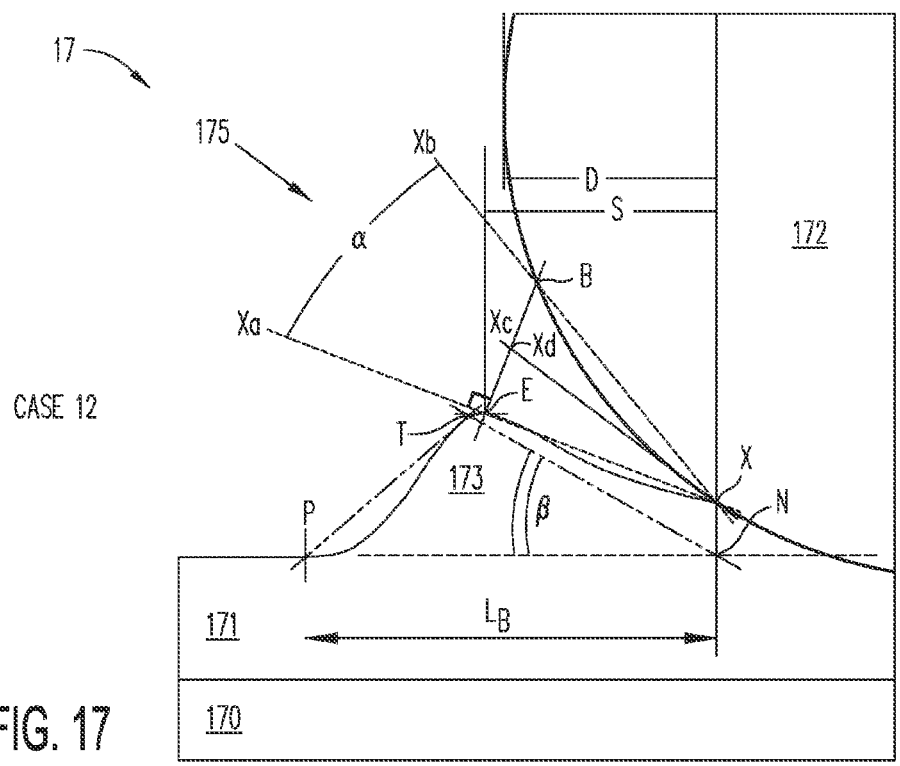

In a twelfth case shown in the cross-sectional view 17 of FIG. 17, a copper bond ball 172 is bonded to the aluminum bonding pad 171 formed on the integrated circuit die 170. The depicted bonding forms a large wave-shaped splash structure 173 having a concave shape that extends from a crevice initiation point X that is located above the top plane of the aluminum pad 171 (e.g., $H_G<H_P$). With the crevice/splash dimension S being larger than the crevice/ball bond dimension D and the lateral base length dimension (LB) extending past the perimeter of the copper bond ball 172, this is a relatively large wave splash structure 173. In addition, the resulting crevice 175 formed between the copper bond ball 172 and concave wave splash structure 173 has a relatively short crevice width EB, crevice angle α, and crevice length X-Xd which characterize a reliable bond connection.

Figure 18:
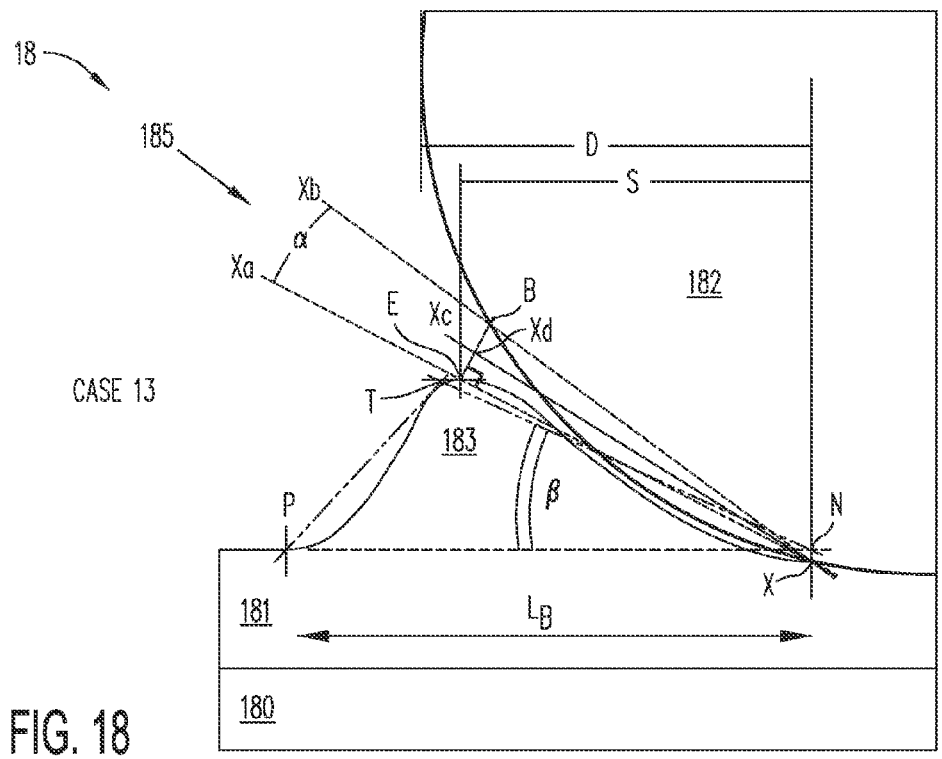

In a thirteenth case shown in the cross-sectional view 18 of FIG. 18, a copper bond ball 182 is bonded to the aluminum bonding pad 181 formed on the integrated circuit die 180. The depicted bonding forms a small splash structure 183 having a convex shape that extends from a crevice initiation point X that is located below the top plane of the aluminum pad 181 (e.g., $H_P<H_G$). With the crevice/splash dimension S being less than the crevice/ball bond dimension D, this is a relatively small wave splash structure 183. Compared to the example case shown in FIG. 12, the crevice 185 formed between the copper bond ball 182 and the convex splash structure 183 has a relatively long crevice length X-Xd which characterizes a relatively poor and unreliable bond connection between the copper bond ball 182 and aluminum bonding pad 181 due to the reduced bond interface area and increased likelihood of mold compound penetration under the ball bond.

Figure 19:
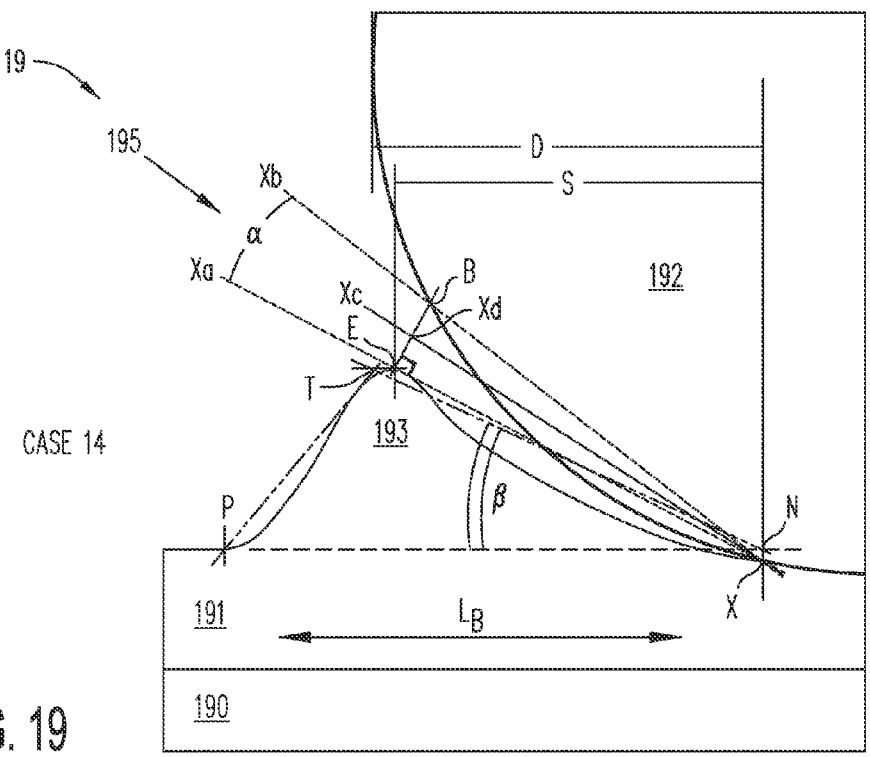

In a fourteenth case shown in the cross-sectional view 19 of FIG. 19, a copper bond ball 192 is bonded to the aluminum bonding pad 191 formed on the integrated circuit die 190. The depicted bonding forms a small splash structure 193 having a concave shape that extends from a crevice initiation point X that is located below the top plane of the aluminum pad 191 (e.g., $H_P<H_G$). With the crevice/splash dimension S being less than the crevice/ball bond dimension D, this is a relatively small wave splash structure 193. Compared to the example case shown in FIG. 12, the crevice 195 formed between the copper bond ball 192 and the concave splash structure 193 has a relatively long crevice length X-Xd which characterizes a relatively poor and unreliable bond connection between the copper bond ball 192 and aluminum bonding pad 191 due to the reduced bond interface area and increased likelihood of mold compound penetration under the ball bond.

Figure 20:
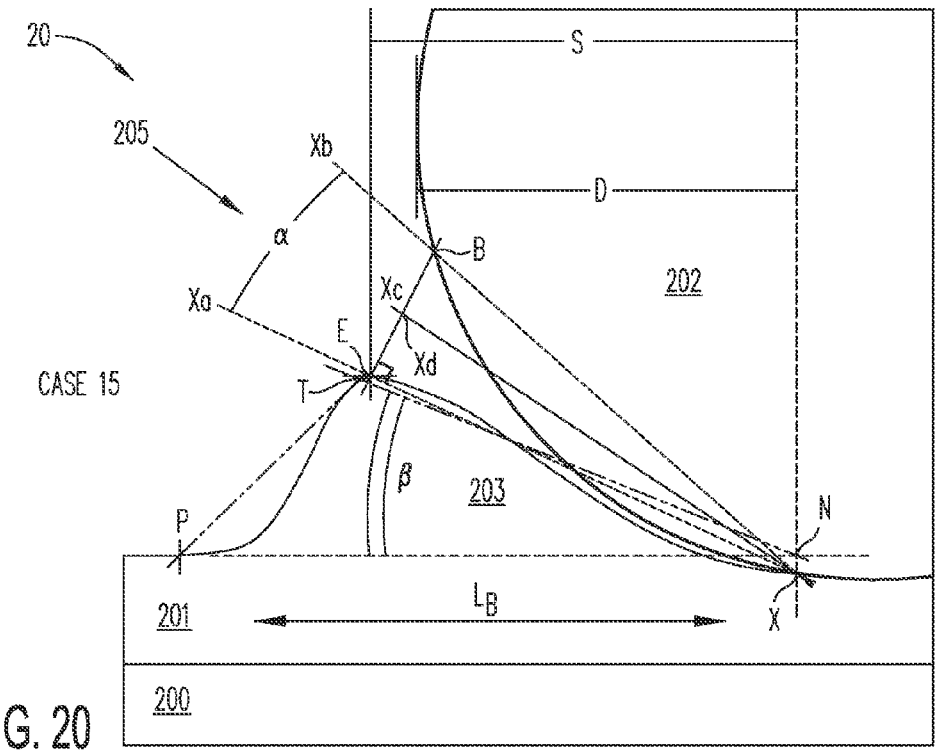

In a fifteenth case shown in the cross-sectional view 20 of FIG. 20, a copper bond ball 202 is bonded to the aluminum bonding pad 201 formed on the integrated circuit die 200. The depicted bonding forms a large splash structure 203 having a convex shape that extends from a crevice initiation point X that is located below the top plane of the aluminum pad 201 (e.g., $H_P<H_G$). With the crevice/splash dimension S being larger than the crevice/ball bond dimension D, this is a relatively large wave splash structure 203. Compared to the example case shown in FIG. 12, the crevice 205 formed between the copper bond ball 202 and the convex splash structure 203 has a relatively long crevice length X-Xd which characterizes a relatively poor and unreliable bond connection between the copper bond ball 202 and aluminum bonding pad 201 due to the reduced bond interface area and increased likelihood of mold compound penetration under the ball bond.

Figure 21:
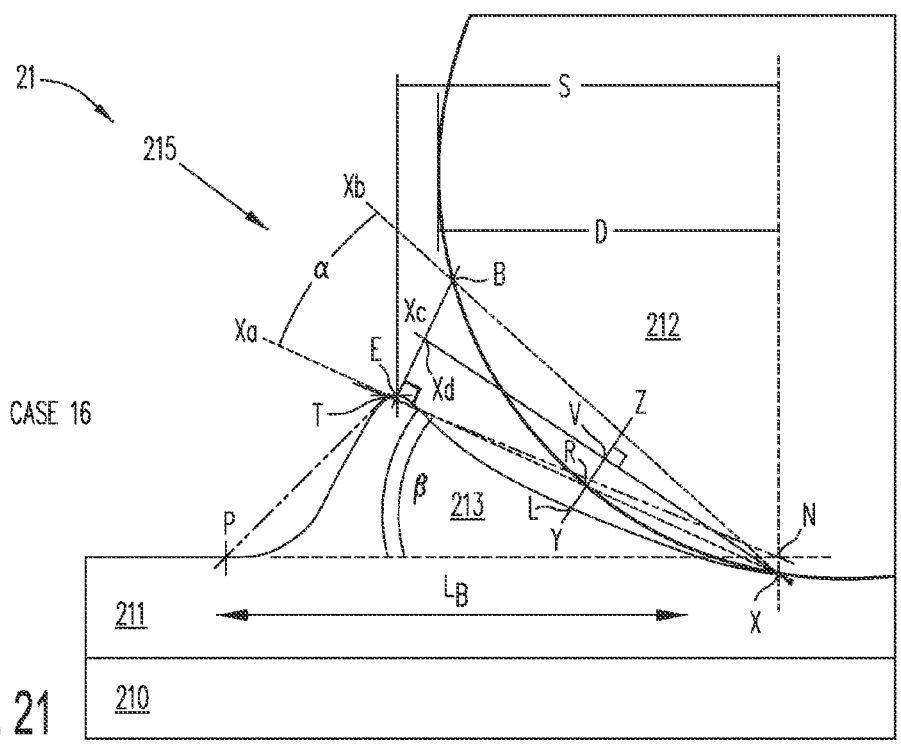

In a sixteenth case shown in the cross-sectional view 21 of FIG. 21, a copper bond ball 212 is bonded to the aluminum bonding pad 211 formed on the integrated circuit die 210. The depicted bonding forms a large splash structure 213 having a concave shape that extends from a crevice initiation point X that is located below the top plane of the aluminum pad 211 (e.g., $H_P<H_G$). With the crevice/splash dimension S being larger than the crevice/ball bond dimension D, this is a relatively large wave splash structure 213. Compared to the example case shown in FIG. 12, the crevice 215 formed between the copper bond ball 212 and the concave splash structure 213 has a relatively long crevice length X-Xd which characterizes a relatively poor and unreliable bond connection between the copper bond ball 212 and aluminum bonding pad 211 due to the reduced bond interface area and increased likelihood of mold compound penetration under the ball bond. In an example embodiment of the case illustrated in FIG. 21, the crevice may have a relatively wide crevice width dimension EB=0.702 μm and relatively long crevice length dimension X-Xd. In addition, a half width crevice dimension may be defined with reference to the mid-point V along the crevice length dimension X-Xd by drawing a perpendicular line YZ at point V which intersects with the splash structure 213 at point L and with the copper ball 212 at point R. In this example, the half width crevice dimension LR having a measure of 0.152 μm is 21.6% of the crevice width dimension EB. The 21.6% value indicates that the crevice width reduced by 78.4% in the first half of the crevice length. In another crevice, if the half width to mouth width ratio was 10%, this would indicate that the crevice narrows much more rapidly than in the first instance. Long crevices that narrow rapidly indicate ball bonds with lower reliability in terms of ball bond interface corrosion failure.

Figure 22:
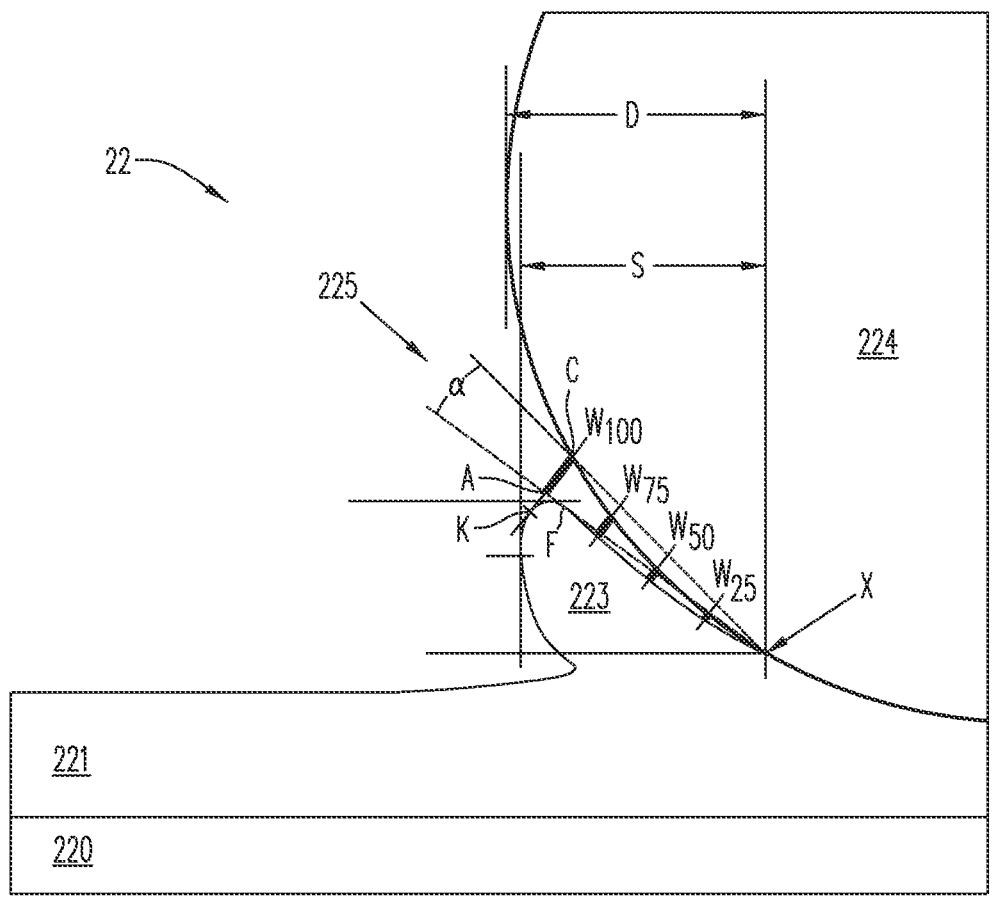
FIG. 22 illustrates additional geometric features to different splash profiles formed by copper ball bonds affixed to aluminum pads.

As will be appreciated, other geometric constructions may be used to characterize the copper ball bond attachment to the aluminum pad in terms of the size, shape, and position of the aluminum splash feature and/or crevice formed thereby. For example and as illustrated in FIG. 22, there is shown a cross-sectional view 22 of a copper bond ball 224 that is bonded to the aluminum bonding pad 221 formed on the integrated circuit die 220 to form a splash structure 223 having a concave shape that extends from a crevice initiation point X that is located above the top plane of the aluminum pad 221 (e.g., $H_G<H_P$). In this example, the length of the crevice or gap 225 may be defined as the distance from start of gap (the initiation point X) to end of gap. For the splash feature (e.g., 223) that does not extend beyond the copper ball edge, the end of the crevice length XA may be defined as the intersection point A between (1) the line extending from the crevice initiation point X through the aluminum splash tangent point F, and (2) the perpendicular intersection line KC that is tangent to the aluminum splash tangent point K. In this case, the width of the gap or crevice may be measured at predetermined intervals along the crevice length line XA defining the gap length. For example, the gap width may be characterized by using perpendicular measurement lines at four measurement points taken at 25, 50, 75, 100% along the gap length line XA to draw four lines across the gap that are perpendicular to the gap length line XA. In addition, the crevice angle may be defined as the angle α enclosed by the two lines XA and XC from the gap initiation point X to the ends of maximum gap width line (W100) (angle AXC). In addition to a splash height dimension (measuring the distance from the undeformed top surface of the aluminum pad 221 to the top of the splash feature 223), a splash length may be defined with reference to a splash-ball tangent line drawn across both the aluminum splash 223 and copper ball 224 by drawing a splash tangent line (not shown) from the crevice initiation point X that is tangent to the splash feature 223, where the splash length is the distance along the splash tangent line from the crevice initiation point X to the splash-ball tangent line. In addition to the vertical distance between the gap initiation point X and the undeformed surface of the aluminum bonding pad 221, a vertical ball height measure may be defined as the vertical distance between the bottom of the copper ball 224 and the undeformed surface of the aluminum bonding pad 221.

Figure 23:
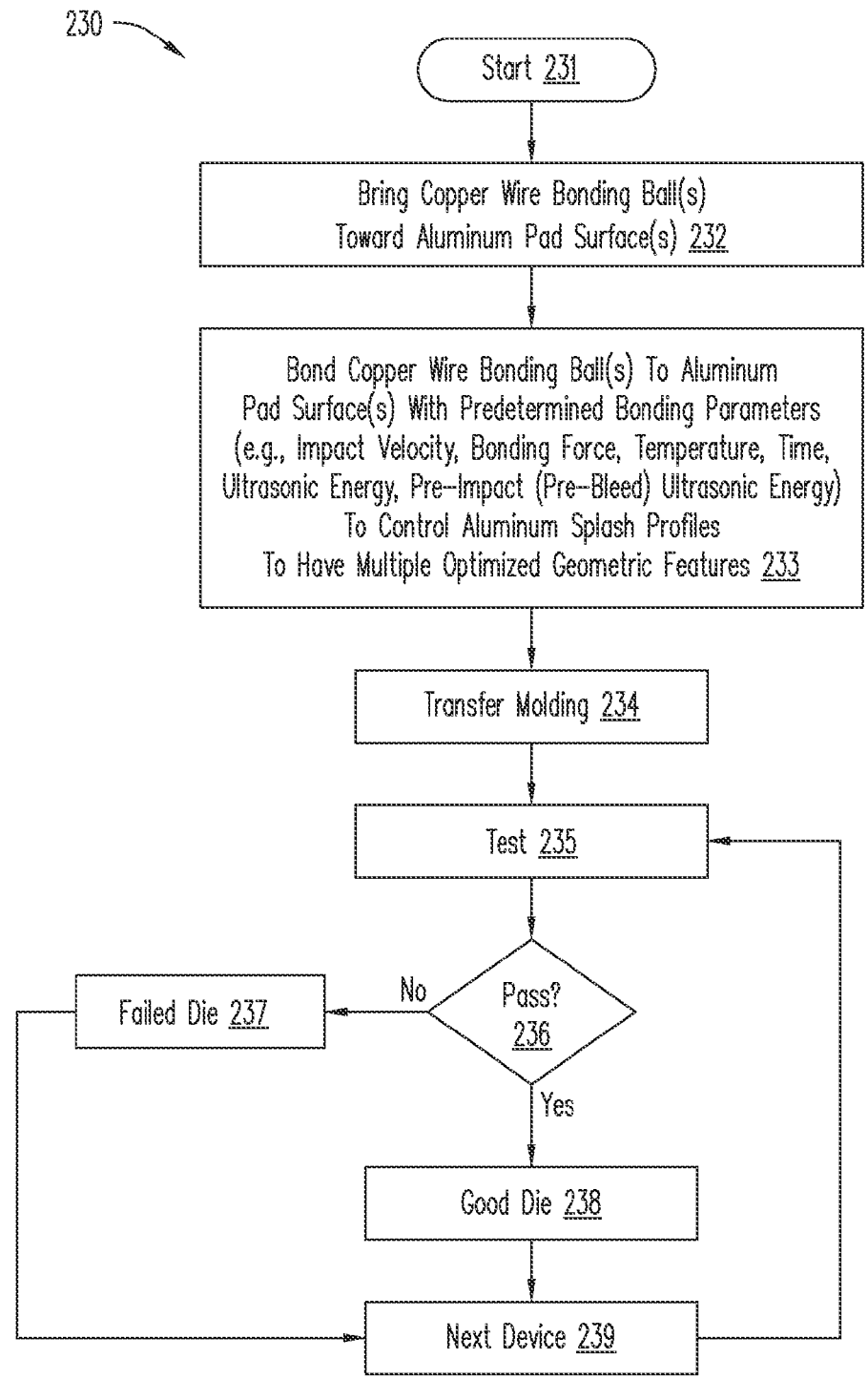
FIG. 23 is a simplified schematic flow chart illustrating various methods for fabricating copper ball bonds to meet a plurality of controlled ball bond splash geometry features for a reliable ball bond-pad attachment.

To further illustrated selected embodiments of the present invention, reference is now made to FIG. 23 which is a simplified schematic flow chart 230 illustrating various methods for fabricating and testing devices in accordance with selected embodiments of the invention. In describing the fabrication methodology 230, the description is intended merely to facilitate understanding of various exemplary embodiments and not by way of limitation. Unless otherwise indicated, subsequent steps may be provided in any desired order. Since the steps illustrated in FIG. 23 and described below are provided by way of example only, it will be appreciated that the sequence of illustrated steps may be modified, reduced or augmented in keeping with the alternative embodiments of the disclosure so that the method may include additional steps, omit certain steps, substitute or alter certain steps, or perform certain steps in an order different than that illustrated in FIG. 23. Thus, it will be appreciated that the methodology of the present invention may be thought of as performing the identified sequence of steps in the order depicted, though the steps may also be performed in parallel, in a different order, or as independent operations that are combined.

Once the methodology starts (step 231), the copper wire is brought towards the aluminum pad surface to initiate the bonding process (step 232). The copper wire typically includes bonding ball is formed at an end of a bonding wire that may be applied by a capillary bonding tool. As the copper bonding ball contacts the aluminum pad surface, the shape of the copper bonding ball may be deformed by the applied bonding force, or alternatively, the desired shape of the copper bonding ball may be preformed or mechanically conditioned beforehand. In selected embodiments, a Free Air Ball (FAB) may be formed on the end of the copper wire from the plasma formed by the spark ignited by the Electronic Flame Off (EFO) system.

At step 233, the copper wire bonding balls are bonded directly to the aluminum pad surface layer using predetermined bonding parameters to control the aluminum splash profile to have multiple optimized geometric features. By properly selecting and controlling the bonding parameters as a combination of heat, pressure and ultrasonic energy to form an intermetallic connection or weld between a wire and a connection pad, the resulting aluminum splash profile will have a splash structure that is formed around substantially the entire perimeter of the ball bond to a predefined limited extent where the elevated splash pad dimension (LB) is less than or equal to twice the outermost lateral splash length dimension (LS), and where the splash-ball crevice is positioned above the top of the undeformed aluminum pad, thereby minimizing opportunities for undesirable mold compound penetration. In addition, the selected bonding parameters are controlled to prevent mold compound penetration by forming short crevice lengths, narrow crevice widths, and a crevice-pad splash index (β) within a predetermined range (e.g., of 20-75°). Copper ball bonding reliability is also promoted by controlling the selected bonding parameters so that the splash height ($H_P$) is less than half the ball height and greater than half the aluminum pad thickness.

In an example embodiment where the selected bonding parameters at step 243 are optimized for an ASM wire bonder to form reliable copper ball bonds to an aluminum bond pad (99.5% Al+0.5 wt % Cu) having a thickness of 1.2 um with bond pad opening of 59 um as the smallest side is shown below:
  a. The bonding temperature is 170° C. as preheat, 200° C. at bonding temperature and post bond temperature 150° C.;
  b. Standby power (USG current, mA): 35.2 to 37.2
  c. Bonding power (USG current, mA): 88 to 93;
  d. Initial bonding force: 15 g;
  e. Bonding force: 40 to 45 g; and
  f. Bonding time: 20 m-sec.

As will be appreciated, two types of bonding concepts can be used to achieve the various bonding profile cases illustrated in the figures, where there are generally two bonding segments used during the bonding processes. The first bonding concept is turning on bonding force with zero bonding power during the first segment, and to use minimal bonding force and optimal bonding power during the second segment. The second bonding concept used to achieve Cases 1 through 16 (illustrated in FIGS. 6-21) is the use of mid-range bonding power and optimal bonding force during the first segment, and lower bonding force and optimal bonding power during the second segment. It will also be appreciated that the effect of the various bonding parameters on achieving the example features illustrated for Cases 1-16 will be modulated by the clamping system used to hold the integrated circuit die assembly in the wire bonding system, the material features and properties of the assembly elements, the material features and properties of the copper wire, the bonding temperature, and the capillary material and design. In general, it is best to firmly clamp the assembly as close to the bonding area as possible. The thickness of the die, and the composition, thickness, and hardness of the aluminum bond pad metal affects the resulting copper ball bond. Higher temperatures are commonly used (>200° C.) when copper wire bonding on a metal lead frame assembly, while lower temperatures (<180° C.) are commonly used when copper wire bonding on a printed circuit board substrate assembly. The thickness and physical and mechanical properties of the lead frame metal, and the thickness of individual metal and dielectric layers in the printed circuit board substrate, and properties of these layers, affect heat transfer and attenuation of ultrasonic energy during the bonding process. The copper wire may be an uncoated, high purity copper alloy, or it may be coated with another metal such as palladium, gold, or silver. The physical and mechanical properties of the free air ball (FAB) affect the interaction with the aluminum pad metal. The capillary material and design affects the efficiency of transfer of energy from the capillary to the ball bond during its formation which affects the quality of the bond to the aluminum pad.

The following explanation is provided to describe how of the various bonding parameters can be controlled to achieve the example features illustrated for Cases 1-16. Compared to the bonding parameter set used to form the bonding profile of Case 1 (FIG. 6), Case 2 (FIG. 7) can be achieved by increasing bonding power and turning off, or reducing pre-bleed. Pre-bleed refers to the level of ultrasonic energy applied to the capillary prior to the initial contact of the copper free air ball (FAB). This means ultrasonic energy is turned on before the FAB touches the aluminum bond pad while maintaining the same level of bonding force. Cases 1 and 2 can be easily achieved by the first bonding concept, while Case 3 (FIG. 8) may be more readily achieved using the second bonding concept during the first and second bonding segments as described above. Case 4 (FIG. 9) conditions may be achieved by increasing the bonding force used in the Case 3 parameter set. Cases 5 and 6 (FIGS. 10 and 11) can be made by increasing both bonding force and bonding power using Case 1 and 2 bonding concepts, respectively, with zero pre-bleed. To achieve the bonding profile of Case 6 (FIG. 11), the bonding force is increased to a higher level than that used in the Case 5 (FIG. 10) setting. And for Cases 7 and 8 (FIGS. 12 and 13), much higher bonding force and power is applied during both bonding segments. For example, this may be required when bonding harder aluminum layers, or when bonding onto aluminum pads that have a thicker aluminum oxide surface layer. Cases 9 to 16 require a different capillary design using a chamfer angle designed to keep more of the FAB inside the chamfer side wall of the tip of capillary than is used for Cases 1 to 8, and can be more easily achieved with the second bonding concept. As will be appreciated, minimum levels of bonding power and bonding force generally produce aluminum splash where distance 'D' is less than distance 'S'. When bonding power is optimal, higher levels of bonding force tend to move point 'X' lower than point 'N'. The crevice width EB for Cases 9 to 16 depends strongly on aluminum thickness and hardness in addition to bonding parameters. Use of a relatively lower bonding force and lower bonding power than those used in previous cases can produce features shown in Case 9. Case 10 can be achieved by increasing bonding force during the first segment of bonding process, or reducing the pre-bleed setting. Cases 11 and 12 require higher bonding power and force than Case 9 and 10 using the same bonding concept. Case 12 can be formed with higher bonding force than used in Case 11, or with use of a lower pre-bleed setting. Cases 13 to 16 can be made with use of higher bonding force and power levels than used for Case 9 to 12. Case 14 may be formed with use of a higher bonding force and lower pre-bleed than level than used in Case 13. Case 15 and 16 may be the result of turning off the pre-bleed, increasing bonding force and decreasing bonding power during the first bonding segment.

Of course, it will be understood that the present invention is not limited to a particular set of bonding parameters. Rather, the optimum bonding parameters are dependent on wire type, pad metallization, device configurations, and other consideration.

Once the bonding of the copper balls and aluminum pads is completed, the individual devices are encapsulated with a transfer mold compounds at step 234. Transfer molding may be used to mold thermoset materials by feeding material into a cavity with simple plunger action on the melted thermoset material.

At this point, the transfer mold material can penetrate into the crevice or gap between the copper ball and aluminum splash feature. And if the crevice is too deep, the transfer mold material can penetrate an undesirable distance under the ball bond, possibly damaging or cratering the aluminum pad.

After packaging the integrated circuit device, the integrated circuit device may be tested at step 235, either with a stress test or a visual test to evaluate the geometric structures of the copper ball bond. As will be appreciated, any stress test may be applied, including but not limited to biased HAST, unbiased HAST, THB, autoclave, and temperature cycling testing. In addition or in the alternative, it will be appreciated that inspection and testing of the copper ball bond geometric features may be performed after bonding of the copper balls and aluminum pads is completed and before molding. If performed after molding, the transfer mold compound must be removed with acids or other removal techniques. In addition or in the alternative, the various geometric structural features described herein may be assessed by use of standard tools and procedures for failure analysis of semiconductor devices, to measure aspects of the aluminum splash and associated crevice or gap, and/or crevice splash index angle of the aluminum splash in relation to the aluminum pad. Next, the test results are assessed at step 236. If the integrated circuit device passes 238 (affirmative outcome to decision 236), the next device may be selected (step 239) for application of the test (step 235). However, if the integrated circuit device fails the test 237 (negative outcome to decision 237), and the test may then be performed on the next device (step 239).

By now it should be appreciated that there is provided herein an integrated circuit wire bond connection and method for manufacturing same. As disclosed, the copper bond wire includes a copper ball and an aluminum bond pad that is directly bonded to the copper ball to form an aluminum splash structure and associated crevice opening between the aluminum splash structure and copper ball and substantially around the entire peripheral bond edge of the copper ball, where the aluminum splash structure is characterized by a first plurality of geometric properties or features indicative of a reliable copper ball bond which are controlled to be within a predetermined range of values. When the copper ball is attached to the aluminum bond pad by applying ultrasonic vibration energy to the copper ball in a first direction, the resulting geometric features may include larger geometric features evaluated in a cross section that is parallel to the first direction and smaller geometric features evaluated in a cross section that is perpendicular to the first direction. In selected embodiments, the first plurality of geometric properties or features for the aluminum splash structure includes a lateral splash size measure (LS) of the lateral extent of the aluminum splash structure which extends at least substantially to, but not substantially past, an outer perimeter of the copper ball; a splash height measure (HS) of the vertical distance from a top surface of the aluminum bond pad to a top surface of the aluminum splash structure that is less than half a ball bond height measure for the copper ball and more than half an original pad thickness measure for the aluminum bond pad; and a gap height measure ($H_G$) of the vertical distance from a lowest point of the crevice opening to the top surface of the aluminum splash structure that is less than the splash height measure. The first plurality of geometric properties for the aluminum splash structure may also include an elevated splash pad measure of the lateral extent of a base portion of the aluminum splash structure that is less than or equal to twice the lateral splash size measure. In other embodiments, the crevice opening between the aluminum splash structure and copper ball is characterized by a second plurality of geometric properties indicative of a reliable copper ball bond, including a crevice initiation plane intersecting the lowest point of the crevice opening and positioned above a top surface of the aluminum bond pad; and a crevice mouth width measure and a crevice length measure, where a ratio of the crevice mouth width measure to the crevice length measure is greater than or equal to 0.1. In some embodiments, the crevice mouth width is measured along a first tangent line from a first tangent intersection point on the aluminum splash structure to a second tangent intersection point on the copper ball, and the crevice length measure is measured along a line from the lowest point of the crevice opening to a midpoint on the first tangent line. In other embodiments, the crevice mouth width is measured along a first tangent line (1) that extends from a first tangent intersection point on the aluminum splash structure to a second intersection point on the copper ball, and (2) that is perpendicular to a second tangent line extending from the lowest point of the crevice opening to a second tangent intersection point on the aluminum splash structure; and the crevice length measure is measured along a line from the lowest point of the crevice opening to the first tangent line. In other embodiments, the crevice mouth width is measured along a first line from a topmost point on the aluminum splash structure to an intersection point on the copper ball, where the first line is perpendicular to a second line extending from the lowest point of the crevice opening to the topmost point on the aluminum splash structure, and where the crevice length measure is measured along a line from the lowest point of the crevice opening to a midpoint on the first line. The aluminum splash structure may also be characterized by a crevice-pad splash index angle within a range of 20-75°, where the crevice-pad splash index angle is included between (1) a first line defining a top surface of the aluminum bond pad and intersecting with a vertical line intersecting the lowest point of the crevice opening at a vertical crevice extension point N, and (2) a second splash extension line from the vertical crevice extension point N to a splash extension point M that is at a perpendicular intersection between horizontal and vertical tangent planes intersecting the aluminum splash structure. In other embodiments, the aluminum splash structure is characterized by a crevice-pad splash index angle within a predetermined range that is included between (1) an aluminum bond pad surface line parallel to a top surface of the aluminum bond pad and extending from an aluminum pad elevation point P to intersect with a vertical line intersecting the lowest point of the crevice opening at a vertical crevice extension point N, and (2) a splash extension line from the vertical crevice extension point N to a splash extension point T that is at an intersection between (a) a horizontal extending through the topmost point on the aluminum splash structure, and (b) and a tangent line extending from the aluminum pad elevation point P to a tangent intersection point on the aluminum splash structure. The plurality of geometric properties may include one or more geometric properties for inner and outer segments of the aluminum splash structure in a first cross section that is parallel to movement of a wire bond transducer used to bond the copper ball bond to the aluminum bond pad, and one or more geometric properties for lateral segments of the aluminum splash structure in a second cross section that is transverse to movement of the wire bond transducer used to bond the copper ball bond to the aluminum bond pad.

In another form, there is provided a method of forming a copper ball bond. As an initial step, a bonding wire is formed that includes a copper ball, and the copper ball is then positioned at a bonding site at an aluminum bond pad. Thereafter, the copper ball is bonded to an aluminum bond pad with a predetermined combination of heat, pressure and ultrasonic vibration energy applied in a first direction. In an example implementation, the combination of heat, pressure and ultrasonic vibration energy includes preheating the bonding wire an copper ball to a preheat temperature of approximately is 170° C.; and heating the copper ball and aluminum bond pad to a bonding temperature of approximately 200° C. when bonding the copper ball to the aluminum bond pad while supplying bonding power current of approximately 88 to 93 mA and applying a bonding force of approximately 40-45 g during a bonding time of approximately 20 msec. As a result, an intermetallic connection layer is formed between the copper ball and the aluminum bond pad and an aluminum splash structure and associated crevice opening between the aluminum splash structure and the copper ball, where the aluminum splash structure is characterized by a first plurality of geometric features indicative of a reliable copper ball bond, comprising a first plurality of larger geometric features evaluated in a cross section that is parallel to the first direction and a second plurality of smaller geometric features evaluated in a cross section that is transverse to the first direction. For example, the geometric features for the aluminum splash structure may include a lateral splash size measure of the aluminum splash structure which extends at least substantially to, but not substantially past, an outer perimeter of the copper ball; a vertical splash height measure from a top surface of the aluminum bond pad to a top surface of the aluminum splash structure that is less than half a ball bond height measure for the copper ball and more than half an original pad thickness measure for the aluminum bond pad: a vertical gap height measure from a lowest point of the crevice opening to the top surface of the aluminum splash structure that is less than the vertical splash height measure; and a crevice-pad splash index angle that is within a range of 20-75°. In addition, the crevice opening may be characterized by a plurality of geometric features indicative of a reliable copper ball bond, including a crevice initiation plane intersecting the lowest point of the crevice opening and positioned above the top surface of the aluminum bond pad; and a crevice mouth width measure and a crevice length measure, where a ratio of the crevice mouth width measure to the crevice length measure is greater than or equal to 0.1. In selected embodiments, the crevice mouth width is measured along a first tangent line (1) that extends from a first tangent intersection point on the aluminum splash structure to a second intersection point on the copper ball, and (2) that is perpendicular to a second tangent line extending from the lowest point of the crevice opening to a second tangent intersection point on the aluminum splash structure; and where the crevice length measure is measured along a line from the lowest point of the crevice opening to a midpoint on the first tangent line.

Although the described exemplary embodiments disclosed herein are directed to various geometric features and structures for a copper ball bond to an aluminum pad and methods for making same, the present invention is not necessarily limited to the example embodiments which illustrate inventive aspects of the present invention that are applicable to a wide variety of transistor fabrication processes and/or structures. For example, the direct bonding of copper bond balls to aluminum connection pads provides equivalent or superior reliability to gold wire bonding to the same package because the copper-aluminum intermetallic is thinner and more robust than the gold-aluminum intermetallic, but selected embodiments may also form reliable bonds with noble metal doped copper wires when the ball bond geometric shape is properly controlled to form aluminum splash structures. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit wire bond connection comprising:
    a copper bond wire comprising a copper ball and an aluminum bond pad that is directly bonded to the copper ball to form an aluminum splash structure and associated crevice opening between the aluminum splash structure and copper ball at a peripheral bond edge of the copper ball, where the aluminum splash structure is characterized by a first plurality of geometric features indicative of a reliable copper ball bond.

2. The integrated circuit wire bond connection of claim 1, where the first plurality of geometric features for the aluminum splash structure comprises:
    a lateral splash size measure of the lateral extent of the aluminum splash structure which extends at least substantially to, but not substantially past, an outer perimeter of the copper ball;
    a splash height measure of the vertical distance from a top surface of the aluminum bond pad to a top surface of the aluminum splash structure that is less than half a ball bond height measure for the copper ball and more than half an original pad thickness measure for the aluminum bond pad; and
    a gap height measure of the vertical distance from a lowest point of the crevice opening to the top surface of the aluminum splash structure that is less than the splash height measure.

3. The integrated circuit wire bond connection of claim 1, where the first plurality of geometric features for the aluminum splash structure comprises an elevated splash pad measure of the lateral extent of a base portion of the aluminum splash structure that is less than or equal to twice the lateral splash size measure.

4. The integrated circuit wire bond connection of claim 1, where the crevice opening between the aluminum splash structure and copper ball is characterized by a second plurality of geometric features indicative of a reliable copper ball bond.

5. The integrated circuit wire bond connection of claim 4, where the second plurality of geometric features for the crevice opening comprises:
    a crevice initiation plane intersecting the lowest point of the crevice opening and positioned above a top surface of the aluminum bond pad; and
    a crevice mouth width measure and a crevice length measure, where a ratio of the crevice mouth width measure to the crevice length measure is approximately 20 percent.

6. The integrated circuit wire bond connection of claim 5, where the crevice mouth width is measured along a first tangent line from a first tangent intersection point on the aluminum splash structure to a second tangent intersection point on the copper ball, and where the crevice length measure is measured along a line from the lowest point of the crevice opening to a midpoint on the first tangent line.

7. The integrated circuit wire bond connection of claim 5, where the crevice mouth width is measured along a first tangent line (1) that extends from a first tangent intersection point on the aluminum splash structure to a second intersection point on the copper ball, and (2) that is perpendicular to a second tangent line extending from the lowest point of the crevice opening to a second tangent intersection point on the aluminum splash structure; and where the crevice length measure is measured along a line from the lowest point of the crevice opening to the first tangent line.

8. The integrated circuit wire bond connection of claim 1, where the aluminum splash structure is characterized by a crevice-pad splash index angle that is within a range of 20-75°.

9. The integrated circuit wire bond connection of claim 8, where the crevice-pad splash index angle is included between (1) a first line defining a top surface of the aluminum bond pad and intersecting with a vertical line intersecting the lowest point of the crevice opening at a vertical crevice extension point N, and (2) a second splash extension line from the vertical crevice extension point N to a splash extension point M that is at a perpendicular intersection between horizontal and vertical tangent planes intersecting the aluminum splash structure.

10. The integrated circuit wire bond connection of claim 1, where the first plurality of geometric features for the aluminum splash structure comprises:
    one or more geometric features for inner and outer segments of the aluminum splash structure in a first cross section that is parallel to movement of a wire bond transducer used to bond the copper ball bond to the aluminum bond pad; and
    one or more geometric features for lateral segments of the aluminum splash structure in a second cross section that is transverse to movement of the wire bond transducer used to bond the copper ball bond to the aluminum bond pad.

11. The integrated circuit wire bond connection of claim 1, where the copper ball is attached to the aluminum bond pad by applying ultrasonic vibration energy to the copper ball in a first direction.

12. The integrated circuit wire bond connection of claim 11, where the first plurality of geometric features indicative of a reliable copper ball bond comprises a first plurality of larger geometric features evaluated in a cross section that is parallel to the first direction and a second plurality of smaller geometric features evaluated in a cross section that is perpendicular to the first direction.

13. The integrated circuit wire bond connection of claim 1, where each of the first plurality of geometric features is controlled to be within a predetermined range.

14. The integrated circuit wire bond connection of claim 5, where the crevice mouth width is measured along a first line from a topmost point on the aluminum splash structure to an intersection point on the copper ball, where the first line is perpendicular to a second line extending from the lowest point of the crevice opening to the topmost point on the aluminum splash structure, and where the crevice length measure is measured along a line from the lowest point of the crevice opening to a midpoint on the first line.

15. The integrated circuit wire bond connection of claim 14, where the aluminum splash structure is characterized by a crevice-pad splash index angle within a predetermined range that is included between (1) an aluminum bond pad surface line parallel to a top surface of the aluminum bond pad and extending from an aluminum pad elevation point P to intersect with a vertical line intersecting the lowest point of the crevice opening at a vertical crevice extension point N, and (2) a splash extension line from the vertical crevice extension point N to a splash extension point T that is at an intersection between (a) a horizontal extending through the topmost point on the aluminum splash structure, and (b) and a tangent line extending from the aluminum pad elevation point P to a tangent intersection point on the aluminum splash structure.

16. A method of forming a copper ball bond, comprising:
    forming a bonding wire comprising a copper ball;
    positioning the copper ball at a bonding site at an aluminum bond pad; and
    bonding the copper ball to an aluminum bond pad with a predetermined combination of heat, pressure and ultrasonic vibration energy applied in a first direction to form an intermetallic connection layer between the copper ball and the aluminum bond pad and an aluminum splash structure and associated crevice opening between the aluminum splash structure and the copper ball, where the aluminum splash structure is characterized by a first plurality of geometric features indicative of a reliable copper ball bond, comprising a first plurality of larger geometric features evaluated in a cross section that is parallel to the first direction and a second plurality of smaller geometric features evaluated in a cross section that is transverse to the first direction.

17. The method of claim 16, where bonding the copper ball to the aluminum bond pad with the predetermined combination of heat, pressure and ultrasonic vibration energy comprises:
    preheating the bonding wire an copper ball to a preheat temperature of approximately is 170° C.; and
    heating the copper ball and aluminum bond pad to a bonding temperature of approximately 200° C. when bonding the copper ball to the aluminum bond pad while supplying bonding power current of approximately 88 to 93 mA and applying a bonding force of approximately 40-45 g during a bonding time of approximately 20 msec.

18. The method of claim 16, where the first plurality of geometric features for the aluminum splash structure comprises:
    a lateral splash size measure of the aluminum splash structure which extends at least substantially to, but not substantially past, an outer perimeter of the copper ball;
    a vertical splash height measure from a top surface of the aluminum bond pad to a top surface of the aluminum splash structure that is less than half a ball bond height measure for the copper ball and more than half an original pad thickness measure for the aluminum bond pad;
    a vertical gap height measure from a lowest point of the crevice opening to the top surface of the aluminum splash structure that is less than the vertical splash height measure; and
    a crevice-pad splash index angle that is within a range of 20-75°.

19. The method of claim 18, where the crevice opening between the aluminum splash structure and copper ball is characterized by a second plurality of geometric features indicative of a reliable copper ball bond, comprising:
    a crevice initiation plane intersecting the lowest point of the crevice opening and positioned above the top surface of the aluminum bond pad; and
    a crevice mouth width measure and a crevice length measure, where a ratio of the crevice mouth width measure to the crevice length measure is greater than or equal to 0.1.

20. The method of claim 19, where the crevice mouth width is measured along a first tangent line (1) that extends from a first tangent intersection point on the aluminum splash structure to a second intersection point on the copper ball, and (2) that is perpendicular to a second tangent line extending from the lowest point of the crevice opening to a second tangent intersection point on the aluminum splash structure; and where the crevice length measure is measured along a line from the lowest point of the crevice opening to a midpoint on the first tangent line.

* * * * *